(12) United States Patent
Lochman et al.

(10) Patent No.: US 11,876,344 B2
(45) Date of Patent: *Jan. 16, 2024

(54) CONDENSATION PREVENTION FOR HIGH-POWER LASER SYSTEMS

(71) Applicant: PANASONIC INTELLECTUAL PROPERTY MANAGEMENT CO., LTD., Osaka (JP)

(72) Inventors: Bryan Lochman, Nashville, TN (US); Matthew Sauter, Cambridge, MA (US); Bien Chann, Merrimack, NH (US)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/075,524

(22) Filed: Dec. 6, 2022

(65) Prior Publication Data

US 2023/0094312 A1    Mar. 30, 2023

Related U.S. Application Data

(63) Continuation of application No. 17/104,481, filed on Nov. 25, 2020, now Pat. No. 11,552,447.
(Continued)

(51) Int. Cl.
*H01S 3/04* (2006.01)
*H01S 5/024* (2006.01)
(Continued)

(52) U.S. Cl.
CPC ........ *H01S 5/02423* (2013.01); *H01S 5/143* (2013.01); *H01S 5/4012* (2013.01);
(Continued)

(58) Field of Classification Search
CPC .... H01S 5/02423; H01S 5/143; H01S 5/4012; H01S 5/4025; H01S 5/4062; H01S 5/02208
See application file for complete search history.

(56) References Cited

U.S. PATENT DOCUMENTS

| | | | |
|---|---|---|---|
| 11,095,084 B1 | 8/2021 | Sauter et al. | |
| 11,552,447 B2 * | 1/2023 | Lochman | H01S 5/4062 |

(Continued)

FOREIGN PATENT DOCUMENTS

| | | |
|---|---|---|
| CN | 108767631 A | 11/2018 |
| JP | 2015130461 A | 7/2015 |

OTHER PUBLICATIONS

International Search Report and Written Opinion for International Application No. PCT/US2020/062204, dated Mar. 15, 2021, 13 pages.

*Primary Examiner* — Kinam Park
(74) *Attorney, Agent, or Firm* — Morgan, Lewis & Bockius LLP

(57) ABSTRACT

In various embodiments, laser systems or resonators incorporate two separate cooling loops that may be operated at different cooling temperatures. One cooling loop, which may be operated at a lower temperature, cools beam emitters. The other cooling loop, which may be operated at a higher temperature, cools other mechanical and/or optical components, for example optical elements such as lenses and/or reflectors.

23 Claims, 11 Drawing Sheets

Related U.S. Application Data

(60) Provisional application No. 62/942,768, filed on Dec. 3, 2019.

(51) Int. Cl.
  *H01S 5/40* (2006.01)
  *H01S 5/14* (2006.01)
  *H01S 5/02208* (2021.01)

(52) U.S. Cl.
  CPC .......... *H01S 5/4025* (2013.01); *H01S 5/4062* (2013.01); *H01S 5/02208* (2013.01)

(56) References Cited

U.S. PATENT DOCUMENTS

| | | | |
|---|---|---|---|
| 2003/0056892 A1* | 3/2003 | Petitbon | H01L 21/4871 361/699 |
| 2007/0291803 A1* | 12/2007 | Crum | H01S 5/02407 372/34 |
| 2013/0259074 A1* | 10/2013 | Newman | H01S 3/22 372/38.1 |
| 2015/0010030 A1* | 1/2015 | Hirota | F28F 27/00 165/104.19 |
| 2017/0093121 A1* | 3/2017 | Huang | C23C 16/45555 |
| 2017/0271837 A1* | 9/2017 | Hemenway | H01S 5/141 |
| 2017/0365978 A1* | 12/2017 | Lochman | B23K 26/38 |
| 2018/0278013 A1 | 9/2018 | Kanskar et al. | |
| 2021/0119411 A1 | 4/2021 | Lochman et al. | |
| 2021/0167574 A1 | 6/2021 | Lochman et al. | |
| 2021/0344158 A1 | 11/2021 | Sauter et al. | |

\* cited by examiner

CONDENSATION PREVENTION FOR HIGH-POWER LASER SYSTEMS

RELATED APPLICATIONS

This application is a continuation of U.S. patent application Ser. No. 17/104,481, filed Nov. 25, 2020, which claims the benefit of and priority to U.S. Provisional Patent Application No. 62/942,768, filed Dec. 3, 2019, the entire disclosure of each of which is hereby incorporated herein by reference.

TECHNICAL FIELD

In various embodiments, the present invention relates to laser systems, specifically laser systems with cooling systems configured to prevent condensation.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Optical systems for laser systems are typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). That is, BPP=NA×D/2, where D is the focusing spot (the waist) diameter and NA is the numerical aperture; thus, the BPP may be varied by varying NA and/or D. The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

Laser systems, or "resonators," such as WBC resonators, produce copious amounts of heat during operation and testing, and are therefore typically cooled to increase their longevity. While various systems designs utilize active liquid cooling to draw heat away from resonator components such as the beam emitters, such cooling systems can present various challenges and issues. For example, beam emitters such as diode lasers typically perform more efficiently, and may potentially have a higher rollover location as a function of current (allowing for more output power), when they are cooled to low temperatures. However, industrial laser systems operate in environments with dew point levels that cause condensation if the external components of the system pass this dew point temperature. In view of such issues, there is a need for solutions enabling high-efficiency cooling of laser resonators, and their components (e.g., beam emitters) while preventing condensation to ensure optimum optical performance.

SUMMARY

Emitter modules, also referred to as laser source or resonator modules (or simply, "resonators"), in accordance with embodiments of the invention have two separate cooling loops that may be operated at different cooling temperatures. One cooling loop, which may be operated at a lower temperature, cools the beam emitters in the resonator. The other cooling loop, which may be operated at a higher temperature, cools other mechanical and/or optical components of the resonator, e.g., optical elements such as lenses, mirrors, etc. The separate cooling loops therefore enable the beam emitters to operate at high efficiency and at high output power, while also addressing heat generated due to, for example, losses in the resonator due to, e.g., grating losses, mirror scatter, micro-optic wing losses, unlocked light propagation within the resonator, etc., in order to maintain resonator stability. Generally, a higher-temperature cooling loop is sufficient to moderate heat not generated at the beam emitters. Localizing the lower-temperature cooling loop to the beam emitters and operation of the resonator cooling loop at higher temperature facilitates prevention of condensation that would occur if the entire resonator were cooled at the lower, beam-emitter, cooling temperature. Such condensation is prevented at least because the resonator cooling loop is more exposed to the environment external to the resonator housing.

Thus, in various embodiments, the resonator cooling loop and the emitter cooling loop are "fluidly isolated" from each other, i.e., do not comingle cooling fluid and do not include conduits that are fluidly connected to each other, at least within the resonator module itself. Outside of the resonator module, the cooling loops may share one or more components and/or conduits, e.g., a larger source of cooling fluid that may be cooled to different temperatures in each of the cooling loops.

In various embodiments, the higher-temperature cooling loop may also be utilized to cool other components of the laser system (e.g., components external to one or more resonator modules), for example, one or more of a combining module that receives and combines beams from multiple resonators, a fiber-optic module for supplying such a combined beam to an optical fiber, the optical fiber itself (e.g., a delivery fiber), and a processing head (e.g., a welding head or a cutting head) attached to the delivery fiber. In this manner, the higher-temperature cooling loop may moderate heat generated at other locations in the system due to, for example, clipping of the beam during spatial combining, losses during polarization beam combining, dichroic loss, fiber losses on the input/output connector, and/or losses or reflections from the work piece at the processing head.

In various embodiments, the lower-temperature cooling loop supplies a cooling fluid, for cooling the beam emitters, at a temperature ranging from, for example, approximately −25° C. to approximately 25° C., or ranging from approximately 5° C. to approximately 10° C. In various embodiments, the higher-temperature cooling loop supplies a cooling fluid (which may be the same as or different from the cooling fluid supplied by the lower-temperature cooling loop) at a temperature ranging from, for example, approximately 20° C. to approximately 50° C., or ranging from approximately 35° C. to approximately 50° C. In various embodiments, the temperature of the cooling fluid supplied by the lower-temperature cooling loop has a temperature that is less than the temperature of the cooling fluid supplied by the higher-temperature cooling fluid by at least approximately 10° C., at least approximately 15° C., at least approximately 20° C., at least approximately 25° C., at least approximately 30° C., at least approximately 35° C., at least approximately 40° C., at least approximately 45° C., or at least approximately 50° C.

Moreover, embodiments of the present invention feature a thermal barrier between the two cooling loops to reduce or minimize distortions due to thermal gradients within the resonator housing. Such distortions could result in beam misalignment or other issues affecting resonator lifetime and performance. In various embodiments, the thermal barrier is accomplished via selection of coolers for laser emitters having components with relatively low thermal conductivity (e.g., alumina, having a thermal conductivity ranging from approximately 5 to approximately 50 W/m-K) and a material for the larger resonator housing having a higher thermal conductivity (e.g., aluminum, having a thermal conductivity ranging from approximately 75 to approximately 250 W/m-K). In this manner, the temperature gradients and related mechanical distortions will remain sufficiently small so as not to cause problematic resonator misalignment.

In various embodiments of the invention, the cooling loop for the beam emitters utilizes a manifold system incorporating multiple components. For example, in various embodiments the cooling loop for the beam emitters features a cooling manifold for containing and flowing cooling fluid to the individual beam emitters, as well as a feeder manifold that connects the cooling manifold to the external cooling system supplying the cooling fluid. The cooling manifold may be a discrete enclosed body that may, at least in one or more locations, not be in direct contact with the internal resonator housing itself. The resulting air gap may insulate the cooling manifold from the housing, helping to prevent or reduce thermal gradients arising in the housing. In various embodiments, the cooling manifold is sealed to the feeder manifold to prevent external, and potentially higher humidity, air from entering the internal resonator cavity.

In various embodiments, one or more portions of (or even the entirety of) the cooling manifold includes, consists essentially of, or consists of a material having a low thermal conductivity (e.g., ranging from approximately 0.01 to approximately 50 W/m-K, ranging from approximately 0.05 to approximately 50 W/m-K, or ranging from approximately 0.1 to approximately 50 W/m-K) in order to insulate the lower-temperature cooling fluid from the external environment. For example, in various embodiments the cooling manifold includes, consists essentially of, or consists of an engineering plastic or polymeric material such as polyetherimide (e.g., ULTEM) or polyetheretherketone (i.e., PEEK). In various embodiments, the plastic material may contain a filler (e.g., in the form of fibers and/or particles), e.g., glass, in order to enhance tensile strength, stiffness, thermal properties, and overall dimensional stability. Such plastics may also advantageously possess low mechanical creep rates, which beneficially prevent the sealing force utilized for the cooling manifold from relaxing over time and causing leakage in the system. The low thermal conductivity of the cooling manifold may also help prevent condensation formation on the exterior of the cooling manifold.

Resonators in accordance with embodiments of the invention may include one or more components, interfaces, and/or control systems detailed in U.S. patent application Ser. No. 15/660,134, filed on Jul. 26, 2017 (the '134 application), and/or U.S. patent application Ser. No. 16/421,728, filed on May 24, 2019, the entire disclosure of each of which is incorporated by reference herein. For example, resonator modules in accordance with embodiments of the invention may include electrical and optical interfaces that interface with complementary features on a beam-combining enclosure in which the individual beams from the modules are combined into a single output beam (and, in some embodiments, coupled into an optical fiber). The optical and electrical interfaces facilitate the easy replacement of input laser sources with a minimal amount, if any, of source alignment. The emitter modules may be insertable into and mate with input receptacles disposed in or on the enclosure in which the input beams are combined to form the output beam. Resonator modules may connect mechanically, electrically, and/or optically with one of multiple input receptacles disposed in or on (or forming portions of) the enclosure for the beam-combining optics.

As known to those of skill in the art, lasers are generally defined as devices that generate visible or invisible light through stimulated emission of light. Lasers generally have properties that make them useful in a variety of applications, as mentioned above. Common laser types include semiconductor lasers (e.g., laser diodes and diode bars), solid-state lasers, fiber lasers, and gas lasers. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double hetero-structure lasers that feature a layer of low bandgap material sandwiched between two high bandgap layers; quantum well lasers that include a very thin middle (quantum well) layer resulting in high efficiency and quantization of the laser's energy; multiple quantum well lasers that include more than one quantum well layer to improve gain characteristics; quantum wire or quantum sea (dots) lasers that replace the middle layer with a wire or dots to produce higher-efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting lasers (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 µm×100 µm. The beam quality along the 1 µm dimension or fast-axis is typically diffraction-limited. The beam quality along the 100 µm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

Embodiments of the present invention may couple one or more laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation, unless otherwise indicated. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs). Herein, it is understood that references to different "wavelengths" encompass different "ranges of wavelengths," and the wavelength (or color) of a laser corresponds to the primary wavelength thereof; that is, emitters may emit light having a finite band of wavelengths that includes (and may be centered on) the primary wavelength.

Laser systems having systems and utilizing techniques for the prevention of condensation in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention also process workpieces at one or more spots or along a one-dimensional processing path, rather than simultaneously flooding all or substantially all of the workpiece surface with radiation from the laser beam. In general, processing paths may be curvilinear or linear, and "linear" processing paths may feature one or more directional changes, i.e., linear processing paths may be composed of two or more substantially straight segments that are not necessarily parallel to each other.

Various embodiments of the invention may be utilized with laser systems featuring techniques for varying BPP of their output laser beams, such as those described in U.S. patent application Ser. No. 14/632,283, filed on Feb. 26, 2015, and U.S. patent application Ser. No. 15/188,076, filed on Jun. 21, 2016, the entire disclosure of each of which is incorporated herein by reference.

Laser systems in accordance with various embodiments of the present invention may also include a delivery mechanism that directs the laser output onto the workpiece while causing relative movement between the output and the workpiece. For example, the delivery mechanism may include, consist essentially of, or consist of a laser head for directing and/or focusing the output toward the workpiece. The laser head may itself be movable and/or rotatable relative to the workpiece, and/or the delivery mechanism may include a movable gantry or other platform for the workpiece to enable movement of the workpiece relative to the output, which may be fixed in place.

In various embodiments of the present invention, the laser beams utilized for processing of various workpieces may be delivered to the workpiece via one or more optical fibers (or "delivery fibers"). Embodiments of the invention may incorporate optical fibers having many different internal configurations and geometries. Such optical fibers may have one or more core regions and one or more cladding regions. For example, the optical fiber may include, consist essentially of, or consist of a central core region and an annular core region separated by an inner cladding layer. One or more outer cladding layers may be disposed around the annular core region. Embodiments of the invention may be utilized with and/or incorporate optical fibers having configurations described in U.S. patent application Ser. No. 15/479,745, filed on Apr. 5, 2017, and U.S. patent application Ser. No. 16/675,655, filed on Nov. 6, 2019, the entire disclosure of each of which is incorporated by reference herein.

Structurally, optical fibers in accordance with embodiments of the invention may include one or more layers of high and/or low refractive index beyond (i.e., outside of) an exterior cladding without altering the principles of the present invention. Various ones of these additional layers may also be termed claddings or coatings, and may not guide light. Optical fibers may also include one or more cores in addition to those specifically mentioned. Such variants are within the scope of the present invention. Various embodiments of the invention do not incorporate mode strippers in or on the optical fiber structure. Similarly, the various layers of optical fibers in accordance with embodiments of the invention are continuous along the entire length of the fiber and do not contain holes, photonic-crystal structures, breaks, gaps, or other discontinuities therein.

Optical fibers in accordance with the invention may be multi-mode fibers and therefore support multiple modes therein (e.g., more than three, more than ten, more than 20, more than 50, or more than 100 modes). In addition, optical fibers in accordance with the invention are generally passive fibers, i.e., are not doped with active dopants (e.g., erbium, ytterbium, thulium, neodymium, dysprosium, praseodymium, holmium, or other rare-earth metals) as are typically utilized for pumped fiber lasers and amplifiers. Rather, dopants utilized to select desired refractive indices in various layers of fibers in accordance with the present invention are generally passive dopants that are not excited by laser light, e.g., fluorine, titanium, germanium, and/or boron. Thus, optical fibers, and the various core and cladding layers thereof in accordance with various embodiments of the invention may include, consist essentially of, or consist of glass, such as substantially pure fused silica and/or fused silica, and may be doped with fluorine, titanium, germanium, and/or boron. Obtaining a desired refractive index for a particular layer or region of an optical fiber in accordance with embodiments of the invention may be accomplished (by techniques such as doping) by one of skill in the art without undue experimentation. Relatedly, optical fibers in accordance with embodiments of the invention may not incorporate reflectors or partial reflectors (e.g., grating such as Bragg gratings) therein or thereon. Fibers in accordance with embodiments of the invention are typically not pumped with pump light configured to generate laser light of a different wavelength. Rather, fibers in accordance with embodiments of the invention merely propagate light along their lengths without changing its wavelength. Optical fibers utilized in various embodiments of the invention may feature an optional external polymeric protective coating or sheath disposed around the more fragile glass or fused silica fiber itself.

In addition, systems and techniques in accordance with embodiments of the present invention are typically utilized for materials processing (e.g., cutting, drilling, etc.), rather than for applications such as optical communication or optical data transmission. Thus, laser beams, which may be coupled into fibers in accordance with embodiments of the invention, may have wavelengths different from the 1.3 μm or 1.5 μm utilized for optical communication. In fact, fibers utilized in accordance with embodiments of the present invention may exhibit dispersion at one or more (or even all) wavelengths in the range of approximately 1260 nm to approximately 1675 nm utilized for optical communication.

In an aspect, embodiments of the invention feature a laser resonator that includes, consists essentially of, or consists of a resonator housing, a plurality of beam emitters, a plurality of components (e.g., optical components and/or optical elements) for receiving and/or manipulating the beams from the beam emitters, an emitter cooling loop, and a housing cooling loop that is fluidly isolated from the emitter cooling loop. The beam emitters are disposed within the resonator housing and each configured to emit one or more beams. The components are disposed within the resonator housing. The emitter cooling loop cools the beam emitters via flow of a first cooling fluid therethrough (i.e., through the emitter cooling loop). The housing cooling loop cools the plurality of components via flow of a second cooling fluid therethrough (i.e., through the housing cooling loop).

Embodiments of the invention may include one or more of the following in any of a variety of combinations. The laser resonator may include a control system for controlling a temperature and/or a flow rate of the first cooling fluid and/or the second cooling fluid. The laser resonator may include one or more temperature sensors (and/or humidity sensors and/or moisture sensors) for monitoring one or more conditions (e.g., temperatures, humidity levels, moisture levels, etc.) within the laser resonator. The control system may be responsive to the one or more sensors. The control system may increase a flow rate of cooling fluid and/or decrease a temperature of cooling fluid if one or more of the conditions exceeds a predetermined threshold. The control system may be configured to supply the first cooling fluid to the emitter cooling loop at a first temperature and the second cooling fluid to the housing cooling loop at a second temperature different from the first temperature. The first temperature may be lower than the second temperature. The first temperature may be higher than the second temperature.

The emitter cooling loop may include a first conduit within an enclosed cooling manifold, the cooling manifold being disposed within the resonator housing. The laser resonator may include a manifold fluid inlet and a manifold fluid outlet each in fluid communication with the first conduit. The laser resonator may include a feeder manifold extending through the resonator housing. The feeder manifold may be separate and discrete from the cooling manifold. The feeder manifold may fluidly connect the manifold fluid inlet and the manifold fluid outlet with the first conduit. The laser resonator may include a first seal between the feeder manifold and the cooling manifold. The first seal may include, consist essentially of, or consist of an o-ring or a gasket. The cooling manifold may be separated from the resonator housing at one or more locations by an air gap therebetween. The laser resonator may include a second seal for preventing flow of air into or out of the resonator housing. The second seal may be disposed between the cooling manifold and the resonator housing. The second seal may include, consist essentially of, or consist of an o-ring or a gasket. The cooling manifold may include, consist essentially of, or consist of a plastic or polymeric material. The plastic or polymeric material may contain a non-plastic filler material (e.g., in the form of a powder, beads, spheres, fibers, particles, etc.). The filler material may include, consist essentially of, or consist of glass. All or a portion of the laser resonator may include, consist essentially of, or consist of one or more metallic materials, e.g., aluminum, stainless steel, copper, etc. The cooling manifold may include, consist essentially of, or consist of polyetherimide and/or polyetheretherketone. The cooling manifold may include, consist essentially of, or consist of a first material. The resonator housing may include, consist essentially of, or consist of a second material. A thermal conductivity of the second material may be greater than a thermal conductivity of the first material.

The housing cooling loop may include, consist essentially of, or consist of a second conduit extending through the resonator housing, a housing fluid inlet in fluid communication with the second conduit, and a housing fluid outlet in fluid communication with the second conduit. The resonator housing may include a base plate (i) having a first side and a second side opposite the first side and (ii) defining an opening therethrough. The beam emitters may be disposed over or on the first side of the base plate. At least some of the components may be disposed over or on the second side of the base plate. The components may include, disposed over or on the second side of the base plate, (i) a dispersive element for combining the beams emitted by the beam emitters into a multi-wavelength beam, and (ii) a partially reflective output coupler for receiving the multi-wavelength beam from the dispersive element, transmitting a first portion of the multi-wavelength beam out of the resonator housing as a resonator output beam, and reflecting a second portion of the multi-wavelength beam back toward the dispersive element (and thence to the beam emitters to stabilize emission wavelengths thereof). At least some of the components may be disposed over or on the first side of the base plate. The components may include, disposed over or on the first side of the base plate, (i) a plurality of slow-axis collimation lenses disposed optically downstream of the plurality of beam emitters, each slow-axis collimation lens configured to receive one or more beams from one of the beam emitters, and (ii) a plurality of folding mirrors disposed optically downstream of the slow-axis collimation lenses and positioned to receive beams therefrom.

In another aspect, embodiments of the invention include a laser resonator that includes, consists essentially of, or consists of a resonator housing, a plurality of beam emitters disposed within the resonator housing, an enclosed cooling manifold disposed within the resonator housing, a manifold fluid inlet, a manifold fluid outlet, and a feeder manifold extending through the resonator housing. The beam emitters are each configured to emit one or more beams. The cooling manifold cools the beam emitters via flow of a first cooling fluid through a first conduit within the cooling manifold. The manifold fluid inlet supplies the first cooling fluid to the cooling manifold. The manifold fluid outlet receives the first cooling fluid from the cooling manifold (i.e., after the first cooling fluid has cooled the beam emitters). The feeder manifold is separate from the cooling manifold and fluidly connects the manifold fluid inlet and the manifold fluid outlet with the first conduit.

Embodiments of the invention may include one or more of the following in any of a variety of combinations. A first seal may be disposed between the feeder manifold and the cooling manifold. The first seal may be the only point of mechanical contact between the feeder manifold and the cooling manifold. The first seal may include, consist essentially of, or consist of an o-ring or a gasket. The cooling manifold may be separated from the resonator housing at one or more locations by an air gap therebetween. The laser resonator may include a second seal for preventing flow of air into or out of the resonator housing. The second seal may be disposed between the cooling manifold and the resonator housing. The second seal may include, consist essentially of, or consist of an o-ring or a gasket.

The cooling manifold may include, consist essentially of, or consist of a plastic or polymeric material. The plastic or polymeric material may contain a non-plastic filler material (e.g., in the form of a powder, beads, spheres, fibers, particles, etc.). The filler material may include, consist essentially of, or consist of glass. All or a portion of the laser resonator may include, consist essentially of, or consist of one or more metallic materials, e.g., aluminum, stainless steel, copper, etc. The cooling manifold may include, consist essentially of, or consist of polyetherimide and/or polyetheretherketone. The cooling manifold may include, consist essentially of, or consist of a first material. The resonator housing may include, consist essentially of, or consist of a second material. A thermal conductivity of the second material may be greater than a thermal conductivity of the first material.

The cooling manifold may be disposed below the plurality of beam emitters. Below each beam emitter, the cooling manifold may define a protrusion extending toward the beam emitter. Each protrusion may be sealed to the beam emitter thereabove via one or more seals. Each said seal may include, consist essentially of, or consist of an o-ring or a gasket. Each beam emitter may include, consist essentially of, or consist of (i) a laser diode or diode bar, (ii) an active cooler disposed beneath the laser diode or diode bar, the active cooler fluidly connected to the first conduit, and (iii) a base plate disposed beneath the active cooler. The active cooler may include, consist essentially of, or consist of an impingement cooler or a microchannel cooler. A portion of the base plate directly underlying the laser diode or diode bar may be separated from the cooling manifold by an air gap. The base plate may include, consist essentially of, or consist of a ceramic material. The base plate may include, consist essentially of, or consist of alumina. The base plate may include, consist essentially of, or consist of a first material. The resonator housing may include, consist essentially of, or consist of a second material. A thermal conductivity of the second material may be greater than a thermal conductivity of the first material.

The laser resonator may include, disposed within the resonator housing, one or more components for receiving and/or manipulating the beams from the beam emitters. The laser resonator may include, fluidly isolated from the cooling manifold and extending through the resonator housing, a second conduit for cooling the one or more components via flow of a second cooling fluid therethrough (i.e., through the second conduit). The laser resonator may include (i) a housing fluid inlet, different from the manifold fluid inlet, for supplying the second cooling fluid to the second conduit, and (ii) a housing fluid outlet, different from the manifold fluid outlet, for receiving the second cooling fluid from the second conduit.

In yet another aspect, embodiments of the invention feature a laser system that includes, consists essentially of, or consists of one or more laser resonators (e.g., a plurality of laser resonators), a beam-combining module, a fiber optic module, and a first cooling loop. Each laser resonator includes, consists essentially of, or consists of (i) a resonator housing, (ii) a plurality of beam emitters, each configured to emit one or more beams, disposed within the resonator housing, and (iii) disposed within the resonator housing, a plurality of components for receiving and/or manipulating the beams from the beam emitters. The beam-combining module is configured to (i) receive one or more beams from each laser resonator, (ii) combine the received beams, and (iii) output one or more combined output beams. The fiber optic module is configured to receive the one or more combined output beams from the beam-combining module and couple the one or more combined output beams into an optical fiber. The first cooling loop is configured to cool, via flow of a first cooling fluid therethrough, (i) the plurality of components of each resonator, (ii) the beam-combining module, and/or (iii) the fiber optic module.

Embodiments of the invention may include one or more of the following in any of a variety of combinations. The first cooling loop may be configured to cool all of (i) the plurality of components of each resonator, (ii) the beam-combining module, and (iii) the fiber optic module. The laser system may include an optical fiber. A first end of the optical fiber may be coupled to the fiber optic module. A processing head may be coupled to a second end of the optical fiber opposite the first end. The first cooling loop may be configured to cool (i) at least a portion of the optical fiber, and/or (ii) the processing head. The laser system may include a second cooling loop for cooling, via flow of a second cooling fluid therethrough, the beam emitters of each resonator. The second cooling loop may be fluidly isolated from the first cooling loop. A temperature of the second cooling fluid may be different from (e.g., less than or greater than) a temperature of the first cooling fluid. The laser system may include a control system for controlling a temperature and/or a flow rate of the first cooling fluid and/or the second cooling fluid. The laser resonator may include one or more temperature sensors (and/or humidity sensors and/or moisture sensors) for monitoring one or more conditions (e.g., temperatures, humidity levels, moisture levels, etc.) within the laser resonator. The control system may be responsive to the one or more sensors. The control system may increase a flow rate of cooling fluid and/or decrease a temperature of cooling fluid if one or more of the conditions exceeds a predetermined threshold. The control system may be configured to supply the first cooling fluid to the first cooling loop at a first temperature and the second cooling fluid to the second cooling loop at a second temperature different from the first temperature. The first temperature may be lower than the second temperature. The first temperature may be higher than the second temperature.

The laser system may include a control system for controlling a temperature and/or a flow rate of the first cooling fluid. The laser resonator may include one or more temperature sensors (and/or humidity sensors and/or moisture sensors) for monitoring one or more conditions (e.g., temperatures, humidity levels, moisture levels, etc.) within the laser resonator. The control system may be responsive to the one or more sensors. The control system may increase a flow rate of cooling fluid and/or decrease a temperature of cooling fluid if one or more of the conditions exceeds a predetermined threshold.

In another aspect, embodiments of the invention feature a method of operating a laser resonator that includes, consists essentially of, or consists of (i) a resonator housing, (ii) a plurality of beam emitters, each configured to emit one or more beams, disposed within the resonator housing, and (iii) disposed within the resonator housing, a plurality of components for receiving and/or manipulating the beams from the beam emitters. The beam emitters are cooled via flow of a first cooling fluid supplied at a first temperature. The plurality of components are cooled via flow of a second cooling fluid supplied at a second temperature different from the first temperature. The plurality of beam emitters are operated (via, e.g., supplying power thereto) to emit the beams therefrom. The beams are manipulated with the plurality of components to form a resonator output beam. The resonator output beam is emitted from the resonator housing.

Embodiments of the invention may include one or more of the following in any of a variety of combinations. The first temperature may be lower than the second temperature. The first temperature may be higher than the second temperature. A workpiece may be processed with the resonator output beam. Processing the workpiece may include, consist essentially of, or consist of cutting, welding, etching, annealing, drilling, soldering, and/or brazing. Processing the workpiece may include, consist essentially of, or consist of physically altering at least a portion of a surface of the workpiece. Manipulating the beams may include, consist essentially of, or consist of (i) combining the beams emitted by the plurality of beam emitters into a multi-wavelength beam, a first portion of the multi-wavelength beam being emitted as the resonator output beam, and (ii) directing a second portion of the multi-wavelength beam back to the plurality of beam emitters to stabilize emission thereof.

The resonator output beam may be combined with one or more additional resonator output beams each emitted from a different additional resonator, to thereby form a combined output beam. A workpiece may be processed with the combined output beam. Processing the workpiece may include, consist essentially of, or consist of cutting, welding, etching, annealing, drilling, soldering, and/or brazing. Processing the workpiece may include, consist essentially of, or consist of physically altering at least a portion of a surface of the workpiece.

In yet another aspect, embodiments of the invention feature a method of operating a laser system that includes, consists essentially of, or consists of (A) two or more laser resonators, each laser resonator including, consisting essentially of, or consisting of (i) a resonator housing, (ii) a plurality of beam emitters, each configured to emit one or more beams, disposed within the resonator housing, and (iii) disposed within the resonator housing, a plurality of components for receiving and/or manipulating the beams from the beam emitters, (B) a beam-combining module, and (C) a fiber optic module. The beam emitters of each laser resonator are cooled via flow of a first cooling fluid supplied at a first temperature. One or more of (i) the plurality of components of each laser resonator, (ii) the beam-combining module, or (iii) the fiber optic module are cooled via flow of a second cooling fluid supplied at a second temperature different from the first temperature. The plurality of beam emitters of each laser resonator are operated to emit the beams from the beam emitters. In each resonator housing, the beams are manipulated with the plurality of components to form a resonator output beam. The resonator output beam formed in each resonator housing is emitted therefrom. The resonator output beams are combined in the beam-combining module to form a combined output beam. The combined output beam is coupled into an optical fiber with the fiber-optic module.

Embodiments of the invention may include one or more of the following in any of a variety of combinations. The first temperature may be lower than the second temperature. The first temperature may be higher than the second temperature. All of (i) the plurality of components of each laser resonator, (ii) the beam-combining module, and (iii) the fiber optic module may be cooled via flow of the second cooling fluid. The laser system may include (i) the optical fiber, a first end of the optical fiber being coupled to the fiber optic module, and (ii) a processing head coupled to a second end of the optical fiber opposite the first end. At least a portion of the optical fiber, and/or the processing head, may be cooled via flow of the second cooling fluid. A workpiece may be processed with the combined output beam. Processing the workpiece may include, consist essentially of, or consist of cutting, welding, etching, annealing, drilling, soldering, and/or brazing. Processing the workpiece may include, consist essentially of, or consist of physically altering at least a portion of a surface of the workpiece. Manipulating the beams in each resonator housing may include, consist essentially of, or consist of (i) combining the beams emitted by the plurality of beam emitters into a multi-wavelength beam, a first portion of the multi-wavelength beam being emitted as the resonator output beam, and (ii) directing a second portion of the multi-wavelength beam back to the plurality of beam emitters to stabilize emission thereof.

In another aspect, embodiments of the invention feature a method of operating a laser resonator. A plurality of input beams are emitted from a plurality of beam emitters disposed on a first side of a resonator module. The beam emitters are cooled via flow of a first cooling fluid supplied in a first cooling loop at a first temperature. The input beams are directed or transmitted through an opening defined by the resonator module to an optical cavity on a second side of the resonator module opposite the first side. Within the optical cavity on the second side of the resonator module, the input beams are combined into a multi-wavelength beam using a plurality of optical components. The optical components are cooled via flow of a second cooling fluid supplied in a second cooling loop at a second temperature different from the first temperature. The second cooling loop is fluidly isolated from the first cooling loop. At least a portion (e.g., only a portion) of the multi-wavelength beam is emitted out of the resonator module as a resonator output beam.

Embodiments of the invention may include one or more of the following in any of a variety of combinations. The first temperature may be lower than the second temperature. The first temperature may be higher than the second temperature. Emitting at least a portion of the multi-wavelength beam out of the resonator module may include, consist essentially of, or consist of (i) reflecting a first portion of the multi-wavelength beam back, through the opening, to the plurality of beam emitters and (ii) transmitting a second portion of the multi-wavelength beam as the resonator output beam. A workpiece may be processed with the resonator output beam. Processing the workpiece may include, consist essentially of, or consist of cutting, welding, etching, annealing, drilling, soldering, and/or brazing. Processing the workpiece may include, consist essentially of, or consist of physically altering at least a portion of a surface of the workpiece.

The resonator output beam may be combined with one or more additional resonator output beams each emitted from a different additional resonator, to thereby form a combined output beam. A workpiece may be processed with the combined output beam. Processing the workpiece may include, consist essentially of, or consist of cutting, welding, etching, annealing, drilling, soldering, and/or brazing. Processing the workpiece may include, consist essentially of, or consist of physically altering at least a portion of a surface of the workpiece.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. Distances utilized herein may be considered to be "optical distances" unless otherwise specified.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
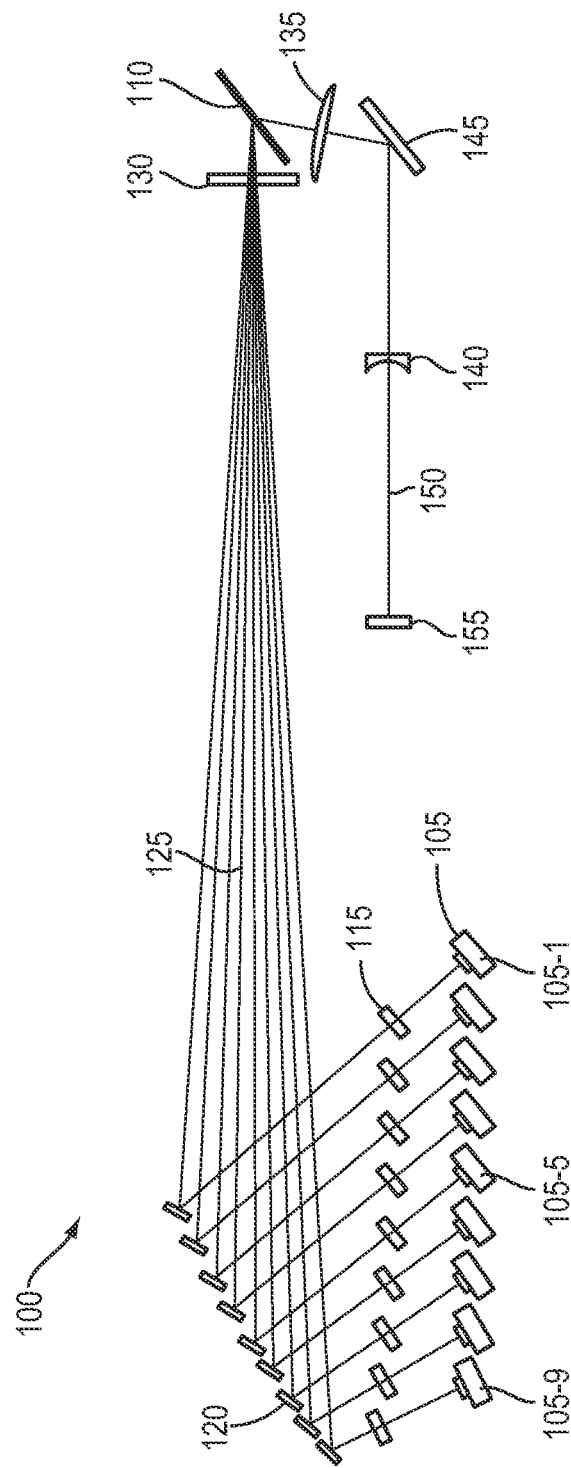
FIG. 1 is a schematic diagram of a laser resonator in accordance with embodiments of the present invention.

The present disclosure will generally utilize WBC resonators as examples of laser systems usable in accordance with embodiments of the present invention. While exemplary embodiments include WBC resonators, embodiments of the invention may also be utilized with other types of laser resonators utilizing one or more beam emitters, and/or with one or more other types of components for a laser system. FIG. 1 schematically depicts various components of a WBC resonator 100 that may be utilized in embodiments of the present invention. In the depicted embodiment, resonator 100 combines the beams emitted by nine different diode bars (as utilized herein, "diode bar" refers to any multi-beam emitter, i.e., an emitter from which multiple beams are emitted from a single package). Embodiments of the invention may be utilized with fewer or more than nine emitters. In accordance with embodiments of the invention, each emitter may emit a single beam, or, each of the emitters may emit multiple beams. The view of FIG. 1 is along the WBC dimension, i.e., the dimension in which the beams from the bars are combined. The exemplary resonator 100 features nine diode bars 105, and each diode bar 105 includes, consists essentially of, or consists of an array (e.g., one-dimensional array) of emitters along the WBC dimension. In various embodiments, each emitter of a diode bar 105 emits a non-symmetrical beam having a larger divergence in one direction (known as the "fast axis," here oriented vertically relative to the WBC dimension) and a smaller divergence in the perpendicular direction (known as the "slow axis," here along the WBC dimension).

In various embodiments, each of the diode bars 105 is associated with (e.g., attached or otherwise optically coupled to) a fast-axis collimator (FAC)/optical twister microlens assembly that collimates the fast axis of the emitted beams while rotating the fast and slow axes of the beams by 90°, such that the slow axis of each emitted beam is perpendicular to the WBC dimension downstream of the microlens assembly. The microlens assembly also converges the chief rays of the emitters from each diode bar 105 toward a dispersive element 110. Suitable microlens assemblies are described in U.S. Pat. No. 8,553,327, filed on Mar. 7, 2011, and U.S. Pat. No. 9,746,679, filed on Jun. 8, 2015, the entire disclosure of each of which is hereby incorporated by reference herein.

In embodiments of the invention in which both a FAC lens and an optical twister (e.g., as a microlens assembly) are associated with each of the beam emitters and/or emitted beams, and SAC lenses (as detailed below) affect the beams in the non-WBC dimension. In other embodiments, the emitted beams are not rotated, and FAC lenses may be utilized to alter pointing angles in the non-WBC dimension. Thus, it is understood that references to SAC lenses herein generally refer to lenses having power in the non-WBC dimension, and such lenses may include FAC lenses in various embodiments. Thus, in various embodiments, for example embodiments in which emitted beams are not rotated and/or the fast axes of the beams are in the non-WBC dimension, FAC lenses may be utilized as detailed herein for SAC lenses.

As shown in FIG. 1, resonator 100 also features a set of SAC lenses 115, one SAC lens 115 associated with, and receiving beams from, one of the diode bars 105. Each of the SAC lenses 115 collimates the slow axes of the beams emitted from a single diode bar 105. After collimation in the slow axis by the SAC lenses 115, the beams propagate to a set of interleaving mirrors 120, which redirect the beams 125 toward the dispersive element 110. The arrangement of the interleaving mirrors 120 enables the free space between the diode bars 105 to be reduced or minimized. Upstream of the dispersive element 110 (which may include, consist essentially of, or consist of, for example, a diffraction grating such as the transmissive diffraction grating depicted in FIG. 1, or a reflective diffraction grating), a lens 130 may optionally be utilized to collimate the sub-beams (i.e., emitted rays other than the chief rays) from the diode bars 105. In various embodiments, the lens 130 is disposed at an optical distance away from the diode bars 105 that is substantially equal to the focal length of the lens 130. Note that, in typical embodiments, the overlap of the chief rays at the dispersive element 110 is primarily due to the redirection of the interleaving mirrors 120, rather than the focusing power of the lens 130.

Also depicted in FIG. 1 are lenses 135, 140, which form an optical telescope for mitigation of optical cross-talk, as disclosed in U.S. Pat. No. 9,256,073, filed on Mar. 15, 2013, and U.S. Pat. No. 9,268,142, filed on Jun. 23, 2015, the entire disclosure of which is hereby incorporated by reference herein. Resonator 100 may also include one or more optional folding mirrors 145 for redirection of the beams such that the resonator 100 may fit within a smaller physical footprint. The dispersive element 110 combines the beams from the diode bars 105 into a single, multi-wavelength beam 150, which propagates to a partially reflective output coupler 155. The coupler 155 transmits a portion of the beam as the output beam of resonator 100 while reflecting another portion of the beam back to the dispersive element 110 and thence to the diode bars 105 as feedback to stabilize the emission wavelengths of each of the beams.

Figure 2A:
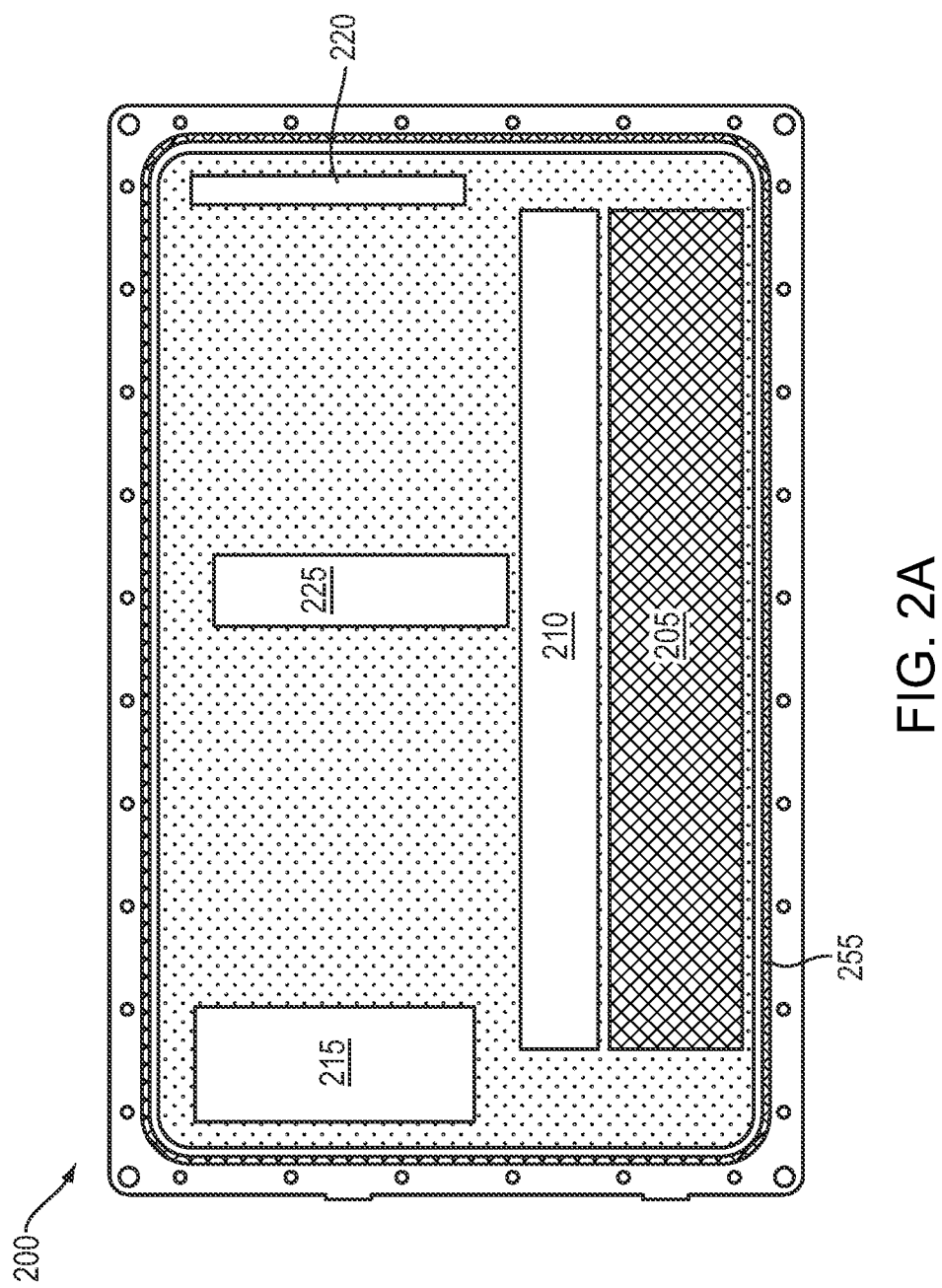
FIG. 2A is a schematic view of a first side of a laser resonator in accordance with various embodiments of the present invention.
Figure 2B:
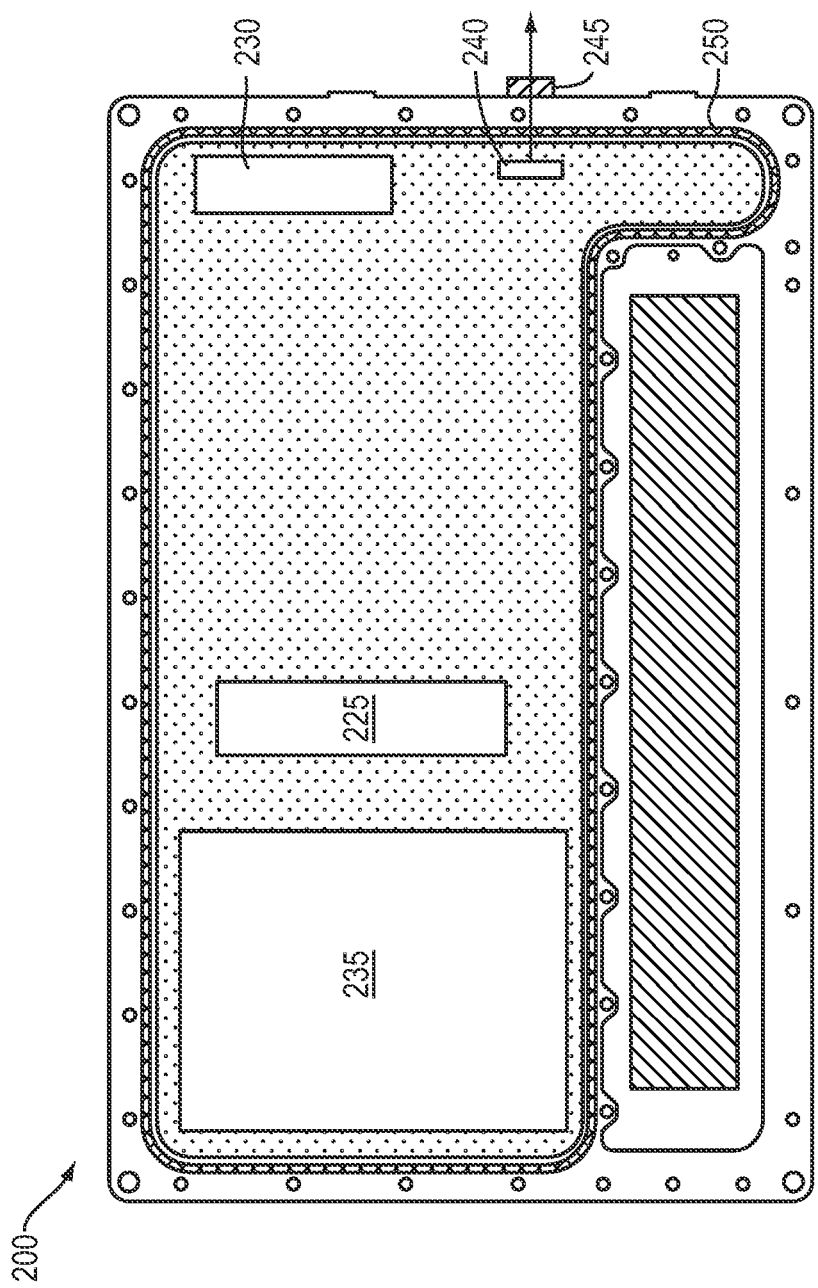
FIG. 2B is a schematic view of a second side of a laser resonator in accordance with various embodiments of the present invention.

Various embodiments of the invention include laser resonators with external lasing cavities, as described in accordance with FIG. 1, and reduce the required size of the resonator by utilizing opposing sides of the resonator to form a larger optical cavity. Reflectors such as mirrors may be utilized to direct the beams within the optical cavity, and, since the optical cavity extends along both sides of the resonator, the overall size of the resonator may be correspondingly reduced for the same cavity size (e.g., compared to a resonator having an optical cavity on only one side). For example, FIGS. 2A and 2B are simplified schematic diagrams of opposite sides of a laser resonator 200 in which areas for various components of the resonator 200 may be mounted. In the exemplary resonator 200, beams from beam emitters mounted in a mounting area 205 may be focused by a group of lenses (and/or other optical elements; e.g., SAC lenses 115) disposed in a lens area 210 toward a group of mirrors (e.g., interleaving mirrors 120) in a mirror area 215. From mirror area 215, the beams from the beam emitters may be directed to another mirror area 220 (containing multiple reflectors such as mirrors, e.g., folding mirrors) and thence through an opening 225 to the opposite side of resonator 200 depicted in FIG. 2B. In FIG. 2B, the beams may be directed to a mirror area 230 (containing multiple reflectors such as mirrors, e.g., folding mirrors), which reflects the beams to a beam-combining area 235. In example embodiments, the beam-combining area 235 may include therewithin a diffusive element such as a diffraction grating (and, in some embodiments, an output coupler), as described in relation to FIG. 1. In various embodiments, the beams each have a different wavelength, and the beams are combined in beam-combining area 235 into an output beam composed of the multiple wavelengths. The beam from the beam-combining area 235 may be directed to a mirror 240 (which, in various embodiments, may be the partially reflective output coupler described in relation to FIG. 1) and thence to an output 245 for emission from the resonator 200. For example, the output 245 may be a window for emission of the beam therethrough or an optical coupler configured to connect to an optical fiber.

FIGS. 2A and 2B also depict sealing paths 250, 255. In various embodiments, cover plates may be mounted over one or both sides of the resonator 200 in order to cover and protect the internal cavities and the components therewithin. For example, the cover plates may be sealed to the resonator 200 via o-rings or other seals, and the cover plates may be attached to the resonator with one or more fasteners (screws, bolts, rivets, etc.) or an adhesive material, and/or via a technique such as welding or brazing.

Figure 3A:
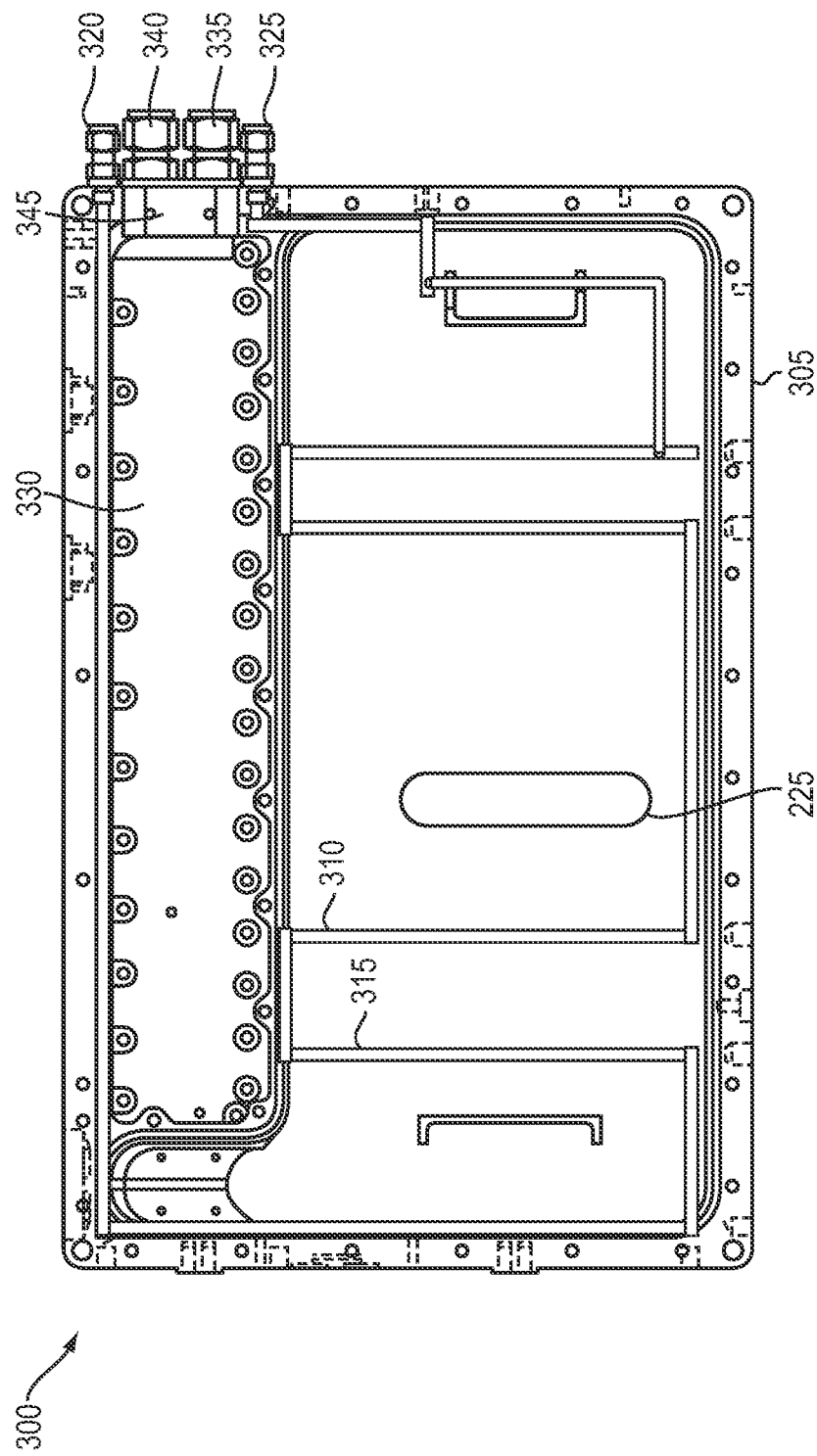
FIG. 3A is a schematic plan view of a laser resonator in accordance with various embodiments of the present invention, showing various internal components.
Figure 3B:
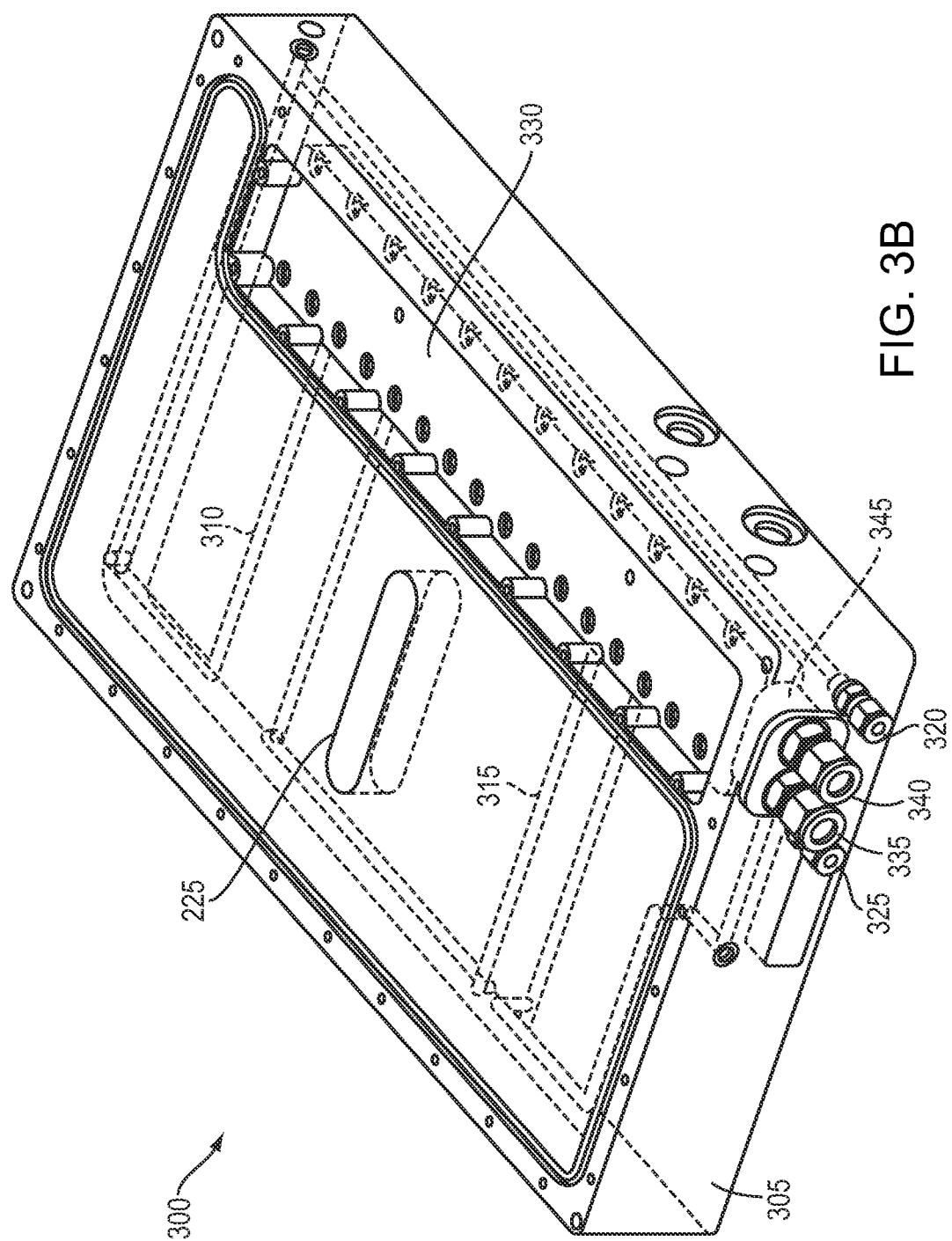
FIG. 3B is a schematic perspective view of a laser resonator in accordance with various embodiments of the present invention, showing various internal components.

FIGS. 3A and 3B schematically depict various internal portions of a laser resonator 300, focusing on cooling systems in accordance with embodiments of the invention. In various embodiments, the resonator 300 may be similar to, and contain similar components as, resonator 200 (and/or resonator 100), but embodiments of the invention also include other laser resonators having different configurations. As shown, the resonator 300 features a resonator housing 305 in which one or more beam emitters (typically a plurality of beam emitters), as well as optical components such as one or more of dispersive elements (e.g., diffraction gratings), mirrors, lenses, prisms, etc. are disposed and function to form an output laser beam to be emitted from the housing 305. Various optical and/or mechanical components may therefore be disposed within the housing 305, and resonator 300 features a housing cooling loop 310 in order to cool such components. In various embodiments, the housing cooling loop 310 includes, consists essentially of, or consists of a conduit 315 in fluid communication with a housing fluid inlet 320 and a housing fluid outlet 325. During operation of resonator 300, cooling (or "heat-exchange") fluid flows from an external fluid-supply system (which may include, consist essentially of, or consist of, for example, a chiller or other heat exchanger and/or a reservoir of cooling fluid; not shown in FIGS. 3A and 3B) into housing fluid inlet 320, is conducted through the conduit 315 so as to remove heat from various components within the housing 305, and exits through the housing fluid outlet 325. Upon exiting, the fluid may be conducted back to the fluid-supply system for additional cooling before being re-introduced into the conduit 315. As shown, the conduit 315 may have a sinuous and/or branching configuration so as to conduct the cooling fluid into proximity with the various components to be cooled within the housing 305. However, the conduit 315 does not extend proximate the beam emitters disposed within the housing 305, which are cooled separately (as detailed below); that is, the distance between the conduit 315 and the beam emitters is generally insufficient for the conduit 315 to noticeably affect the temperature of the beam emitters. At least in part to prevent or reduce condensation on the housing 305, the cooling fluid within the housing cooling loop 310 is cooled to only a moderately cool temperature (at least, compared to the temperature to which beam emitters may be cooled, as detailed below).

As shown, also disposed within the housing 305 is an emitter cooling loop that includes, consists essentially of, or consists of a cooling manifold 330, a manifold fluid inlet 335, a manifold fluid outlet 340, and a feeder manifold 345 that fluidly connects the cooling manifold 330 to the manifold fluid inlet 335 and the manifold fluid outlet 340. During operation of resonator 300, cooling fluid flows from an external fluid-supply system (which may include, consist essentially of, or consist of, for example, a chiller or other heat exchanger and/or a reservoir of cooling fluid; not shown in FIGS. 3A and 3B) into manifold fluid inlet 335, is conducted through the cooling manifold 330 so as to remove heat from the beam emitters within the housing 305, and exits through the manifold fluid outlet 340. Upon exiting, the fluid may be conducted back to the fluid-supply system for additional cooling before being re-introduced into the emitter cooling loop. In various embodiments, the fluid-supply system for the emitter cooling loop is separate and discrete from the fluid-supply system for the housing cooling loop 310, while in other embodiments the fluid-supply systems share one or more common components. In some embodiments, the emitter cooler loop and the housing cooling loop may utilize different (i.e., different types of) heat-exchange fluids. In various embodiments, the cooling fluid utilized in the emitter cooling loop is cooled to a low temperature, i.e., lower than the temperature at which the fluid for the housing cooling loop 310 is cooled, in order to maximize the efficiency and performance of the beam emitters in resonator 300. In addition, in various embodiments, at least in order to prevent or reduce condensation on housing 305 and/or components therewithin, the cooling manifold 330 is isolated from the components cooled by the housing cooling loop 310.

In embodiments in which multiple beam emitters are present within the resonator 300, the emitter cooling loop may conduct cooling fluid (e.g., water (e.g., distilled or filtered water) or another heat-exchange fluid such as a glycol) to the beam emitters in series or in parallel. In various embodiments, the cooling manifold 330 may be disposed within a cavity formed within the housing 305 separated from other internal components via an internal housing wall. In various embodiments, one or more portions (or even the entirety) of the external surface of the cooling manifold 330 may not be in direct mechanical contact with the housing 305. The resulting air gap(s) act as thermal insulators that prevent or reduce thermal gradients within the housing 305.

In various embodiments, the feeder manifold 345 extends through at least a portion of the thickness of the housing 305 and may even extend therefrom on one or both sides of the housing wall. That is, the feeder manifold 345 may extend outward beyond the housing wall as well as inward within the housing wall. In various embodiments, and as shown in more detail in subsequent figures, the feeder manifold 345 may be sealed to the cooling manifold 330 via one or more seals (e.g., o-rings, gaskets, etc.). In various embodiments, the resulting seal prevents or reduces the flow of external air, which may contain more humidity, into the housing 305. In various embodiments, the resonator 300 may also feature an air-exchange or conditioning system (not shown) which removes humidity (and/or, in some embodiments, problematic airborne species such as siloxanes) from the housing 305 by conducting air from the housing 305, through a desiccant and/or other treatment system, and back into the housing 305. Suitable systems are detailed in U.S. patent application Ser. No. 17/071,205, filed Oct. 15, 2020, the entire disclosure of which is incorporated by reference herein.

In various embodiments, one or more portions of (or even the entirety of) the cooling manifold 330 (and/or the feeder manifold 345) includes, consists essentially of, or consists of a material having a low thermal conductivity (e.g., ranging from approximately 0.01 to approximately 50 W/m-K, ranging from approximately 0.05 to approximately 50 W/m-K, or ranging from approximately 0.1 to approximately 50 W/m-K) in order to insulate the lower-temperature cooling fluid from the external environment and/or from the remaining portions of the housing 305. For example, in various embodiments the cooling manifold 330 includes, consists essentially of, or consists of an engineering plastic or polymeric material such as polyetherimide (e.g., ULTEM) or polyetheretherketone (PEEK). In various embodiments, the plastic material may contain a filler (e.g., in the form of fibers and/or particles), e.g., glass, in order to enhance tensile strength, stiffness, thermal properties, and overall dimensional stability. Such plastics may also advantageously possess low mechanical creep rates, which beneficially prevent the sealing force utilized for the cooling manifold 330 from relaxing over time and causing leakage in the resonator 300. The low thermal conductivity of the cooling manifold 330 may also help prevent condensation on the exterior of the cooling manifold 330. In contrast, one or more portions of the housing 305 and/or the cooling loop 310 may include, consist essentially of, or consist of a material having a higher thermal conductivity (e.g., aluminum, having a thermal conductivity ranging from approximately 75 to approximately 250 W/m-K), in order to prevent condensation on or in the housing 305.

Figure 4A:
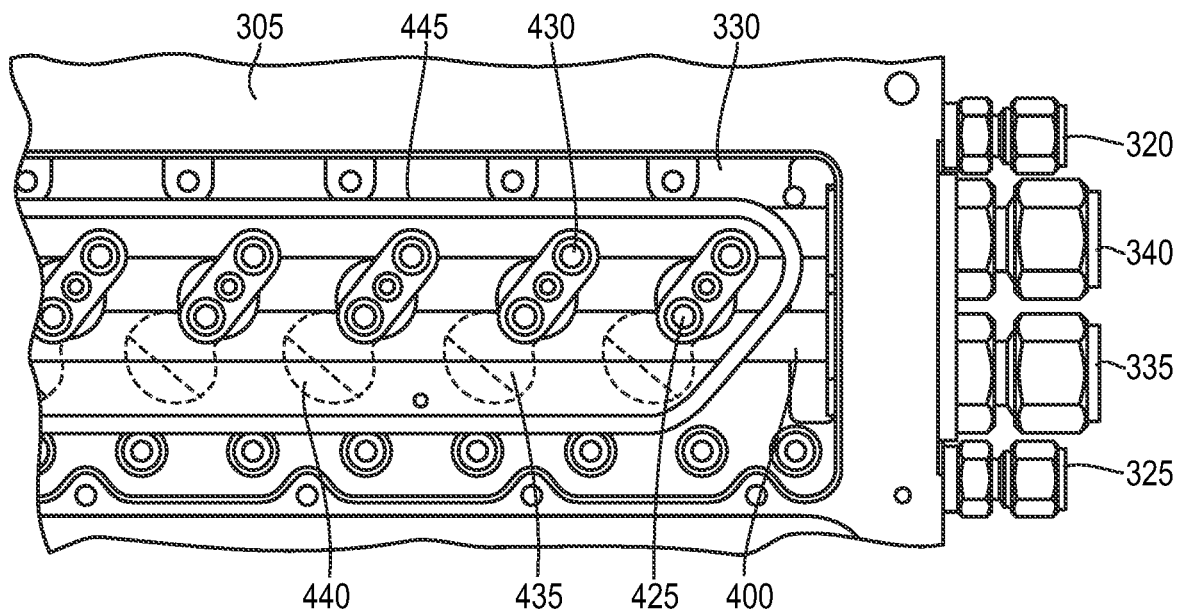
FIG. 4A is a bottom cutaway view of a portion of a laser resonator in accordance with various embodiments of the present invention.
Figure 4B:
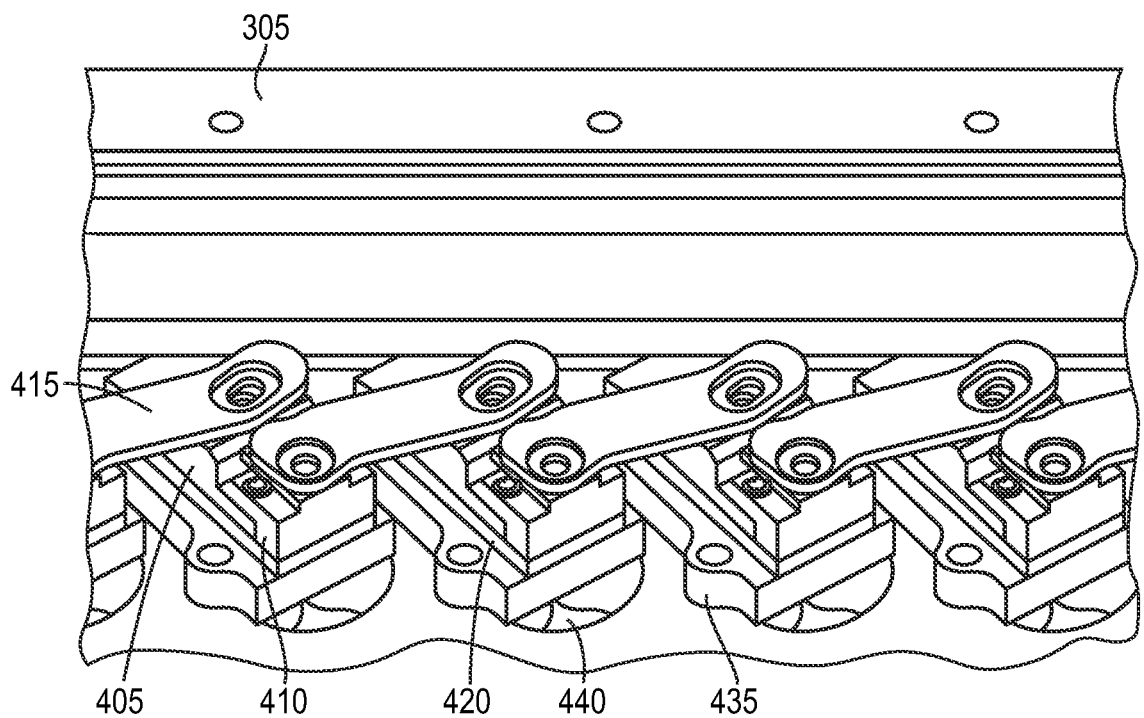
FIG. 4B is a perspective top view of a portion of a laser resonator in accordance with various embodiments of the present invention.

FIG. 4A (bottom cutaway view) and FIG. 4B (perspective top view) depict various components of the resonator 300, with specific focus on the beam emitters and the emitter cooling loop. In the illustrated embodiment, cooling fluid flows into the cooling manifold 330 from the manifold fluid inlet 335, through a conduit 400 that is in fluid communication with the individual active coolers for the individual beam emitters, and back to the manifold fluid outlet 340 via the conduit 400. As shown more clearly in FIG. 4B, each beam emitter, e.g., diode bar or diode laser (not easily shown in FIG. 4B) is associated with two electrode contacts 405, 410 that are electrically coupled to the anode and cathode of the beam emitter and that are otherwise electrically isolated from each other. As shown, the beam emitters may be electrically connected in series via electrical connections (e.g., bus bars 415) that electrically connect the electrode contact 405 from one beam emitter to the electrode contact 410 of the neighboring beam emitter.

As shown in the exemplary illustrated embodiment, each beam emitter may also be associated with an active cooler 420, which in various embodiments is integrated into the electrode contact 405. As shown in FIG. 4A, cooling fluid from the emitter cooling loop may be conducted upwards to the active cooler 420 via an aperture 425 and, after cooling the beam emitter, back to the conduit 400 via an aperture 430. Within the active cooler 420, the cooling fluid may flow near, and/or impinge on the upper surface of a cavity underlying the beam emitter, and the flow and/or impingement of the cooling fluid cools the beam emitter. Exemplary active coolers and electrode contacts are described in U.S. patent application Ser. No. 15/627,917, filed on Jun. 20, 2017, and U.S. patent application Ser. No. 16/654,339, filed on Oct. 16, 2019, the entire disclosure of each of which is incorporated by reference herein. Other active coolers usable in embodiments of the present invention include microchannel coolers, i.e., multi-layer structures shaped and/or cut so that the layers thereof, when stacked together to form a unified whole, define channels therewithin for the conduction of cooling fluid therein. Exemplary microchannel coolers are depicted and described in U.S. patent application Ser. No. 15/271,773, filed on Sep. 21, 2016, the entire disclosure of which is incorporated by reference herein.

As shown in FIG. 4B, the active cooler 420 of each beam emitter may be disposed over or on a base plate 435 that is mechanically coupled to the housing 305. In various embodiments, deleterious condensation on housing 305 and/or one or more components therewithin is reduced or prevented by a thermal barrier constituted, at least in part, by the base plates 435. For example, in various embodiments, the base plates 435 include, consist essentially of, or consist of a material having a relatively low thermal conductivity (e.g., ranging from approximately 0.5 to approximately 50 W/m-K, ranging from approximately 1 to approximately 50 W/m-K, or ranging from approximately 5 to approximately 50 W/m-K), for example alumina, that acts to thermally isolate the beam emitters and/or the emitter cooling loop. This thermal isolation also, in various embodiments, helps prevent thermal gradients and resulting mechanical distortion in resonator 300, particularly in embodiments in which the housing 305 itself includes, consists essentially of, or consists of a material with higher thermal conductivity (e.g., ranging from approximately 75 to approximately 250 W/m-K) such as aluminum. In various embodiments, each base plate 435 may also be electrically insulating in order to prevent spurious electrical conduction through the housing 305.

As also shown in FIGS. 4A and 4B, the front portion of each base plate 435 may be disposed over, and at least partially thermally insulated from housing 305 by, an opening 440 in resonator housing 305 that forms an air gap below the base plate 435. As shown in FIG. 4A, a seal 445 (e.g., an o-ring, gasket, etc.) may be disposed between the cooling manifold 330 and the housing 305 to help prevent ingress of external air into the housing 305.

Figure 5A:
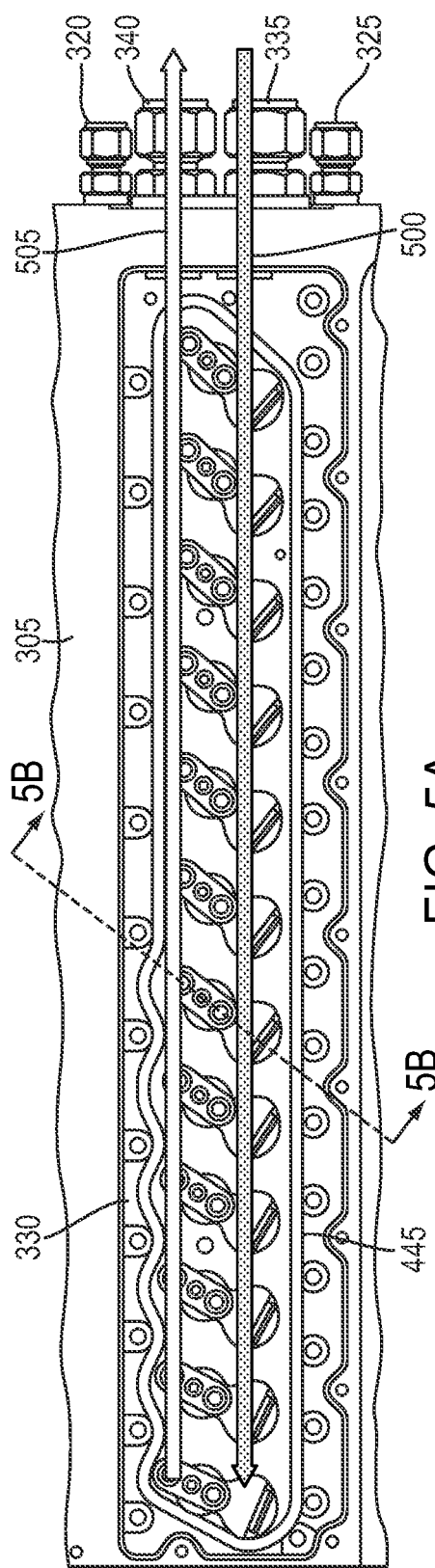
FIG. 5A is a bottom cutaway view of a portion of a laser resonator in accordance with various embodiments of the present invention.
Figure 5B:
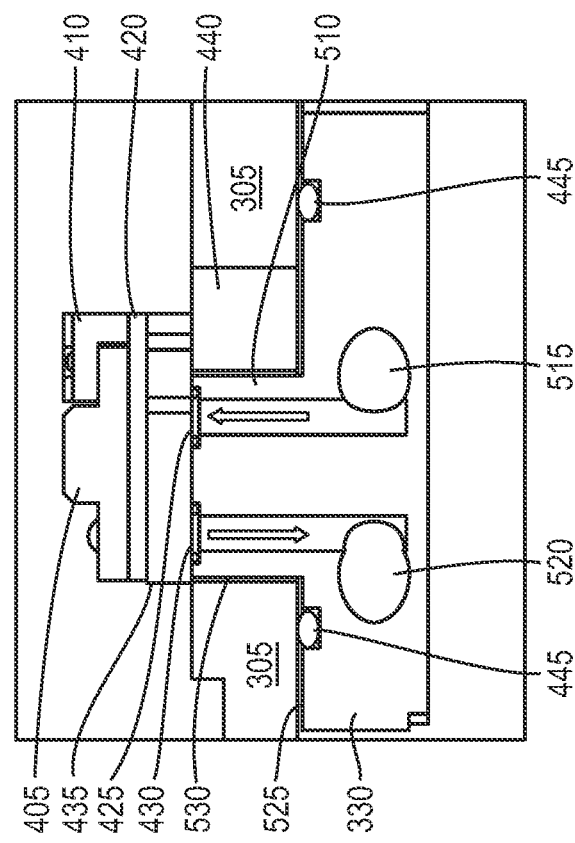
FIG. 5B is a cross-sectional view of the laser-resonator portion of FIG. 5A taken along the line 5B-5B in FIG. 5A.

FIG. 5A is an expanded version of FIG. 4A depicting the emitter cooling loop in accordance with various embodiments of the invention, with arrows 500, 505 representing the flow of cooling fluid into and out of the cooling manifold 330. FIG. 5B is a cross-sectional view taken along the line 5B-5B in FIG. 5A. As shown, cooling fluid within the cooling manifold 330 flows upward, into a protrusion 510 defined by the cooling manifold 330, via a fluid inlet 515, and back into the conduit 400 via a fluid outlet 520. As described in relation to FIG. 4A, the protrusion 510 of the cooling manifold 330 is sealed to the base plate 435 at apertures 425, 430 via seals such as o-rings or gaskets. And, as also described in relation to FIG. 4B, the air gap formed by opening 440 in the housing 305, which is disposed beneath the portion of base plate 435 directly underlying the beam emitter itself, provides advantageous thermal isolation. As mentioned above, additional air gaps, for example air gaps 525, 530, may also be disposed between the cooling manifold 330 and the housing 305 for improved thermal isolation.

Figure 5C:
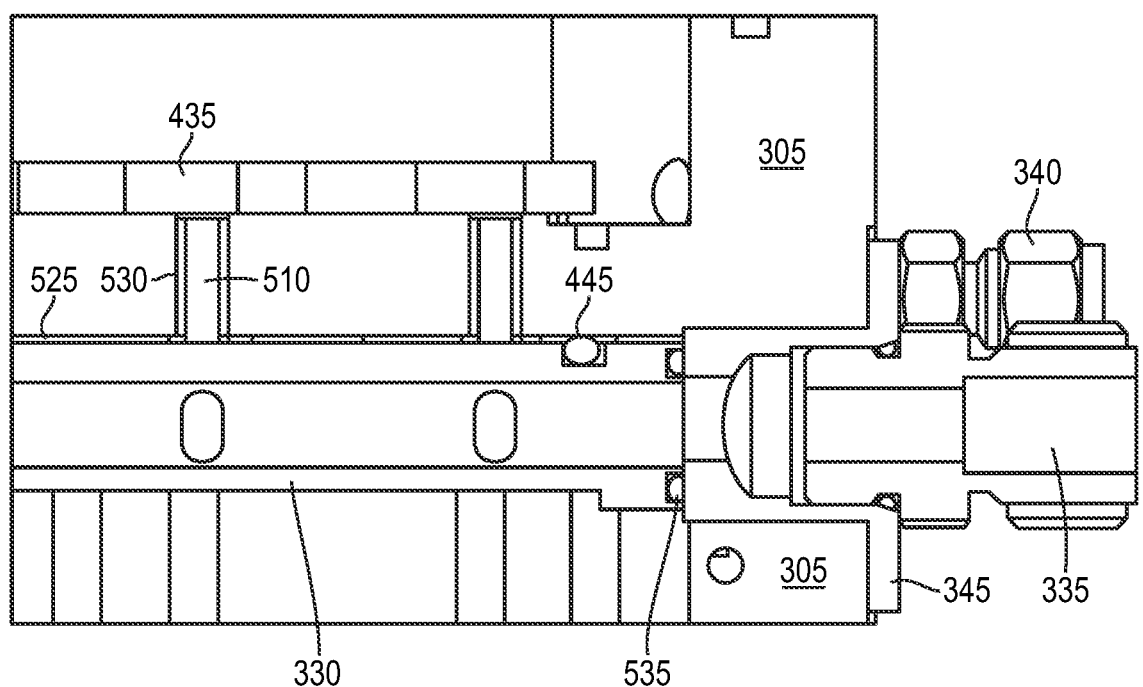
FIG. 5C is a schematic cross-section of a portion of a cooling loop in accordance with various embodiments of the present invention.

FIG. 5C is a schematic cross-section of a portion of the emitter cooling loop near the feeder manifold 345. In various embodiments, the feeder manifold 345 includes, consists essentially of, or consists of any of the materials detailed herein for cooling manifold 330, e.g., a plastic or polymeric material such as an engineering plastic. In other embodiments, the feeder manifold 345 includes, consists essentially of, or consists of one or more different materials. As mentioned above, the feeder manifold 345 fluidly connects the cooling manifold 330 with the manifold fluid inlet 335 and the manifold fluid outlet 340. As shown in FIG. 5C, the feeder manifold 345 may be sealed to the cooling manifold 330 via a seal 535, e.g., an o-ring or gasket, in order to help prevent the exchange of air from within and without the resonator 300. In various embodiments, the feeder manifold 345 may not be otherwise physically connected to the cooling manifold 330. In various embodiments, the provision of feeder manifold 345 as a separate and discrete component, rather than as a portion of cooling manifold 330, improves the mechanical stability of cooling manifold 330 and the delicately aligned beam emitters and associated components. That is, the seal 535 between the feeder manifold 345 and the cooling manifold 330 may isolate the cooling manifold 330 from mechanical forces acting on the feeder manifold 345 (e.g., due to the connection of coolant lines to the inlet 335 and/or outlet 340) and preserve the integrity of the cooling manifold 330.

Figure 6:
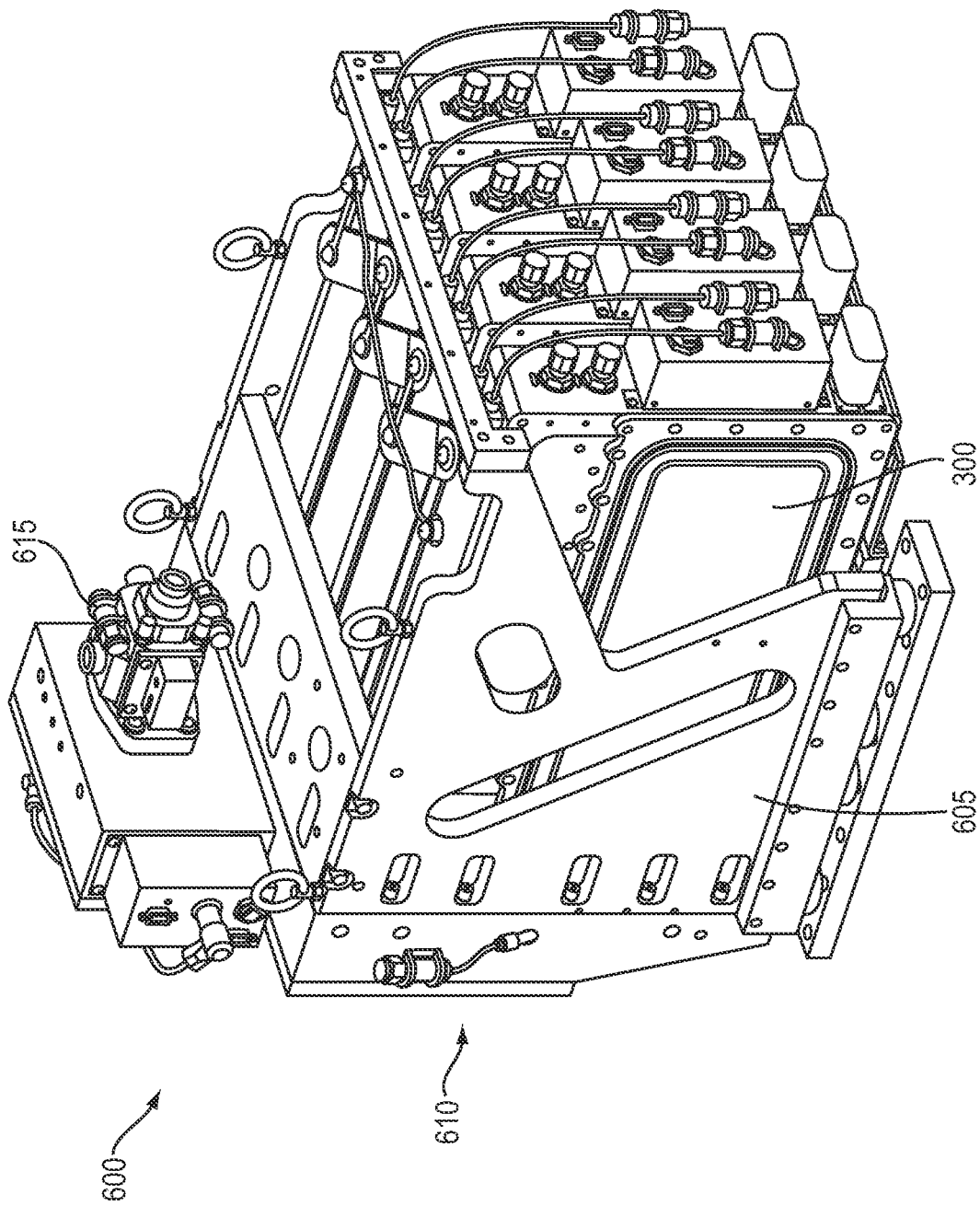
FIG. 6 is a perspective view of a laser engine incorporating multiple laser resonators in accordance with various embodiments of the present invention.

In various embodiments of the invention, a laser system incorporates multiple resonators 300, and the output beams from the resonators 300 are combined downstream (e.g., within a master housing and/or by one or more optical elements) into a single output beam that may be directed to a workpiece for processing (e.g., welding, cutting, annealing, etc.) and/or coupled into an optical fiber. For example, FIG. 6 depicts an exemplary laser system (or "laser engine") 600 in accordance with embodiments of the invention. In laser system 600, multiple laser resonators 300 are mounted within a master housing 605, and the output beams from the resonators 300 are emitted into a beam-combining module 610 thence to a fiber optic module 615. In exemplary embodiments, beam-combining module 610 may contain one or more optical elements, such as mirrors, dichroic mirrors, lenses, prisms, dispersive elements, polarization beam combiners, etc., that may combine beams received from the various resonators into one or more output beams. In various embodiments, the fiber-optic module 615 may contain, for example, one or more optical elements for adjusting output laser beams, as well as interface hardware connecting to one or more optical fibers for coupling of the beams into the optical fiber(s). While laser engine 600 is depicted as including four resonators 300, laser engines in accordance with embodiments of the invention may include one, two, three, or five or more laser resonators.

In various embodiments of the invention, the cooling fluid utilized in the cooling loop 310 to cool the non-emitter components of the resonator 300 may be shared (e.g., in parallel or in series) with other resonators in a laser engine and/or with other components of the laser engine such as the beam-combining module and/or fiber optic module. For example, in various embodiments, the cooling fluid utilized in the cooling loop 310 may be utilized to cool an optical fiber (e.g., a delivery fiber) attached to the fiber optic module and/or a processing head attached to the optical fiber (not shown in FIG. 6). For example, the cooling fluid utilized in the cooling loop 310 may also be directed into and/or through a cooling jacket disposed around at least a portion of the delivery fiber, and/or the processing head. Exemplary processing heads may include, within an enclosure, one or more optical elements (e.g., lenses and/or mirrors) for manipulating the beam received from the fiber optic module, via the optical fiber, and focusing the beam onto a workpiece for processing.

Figure 7:
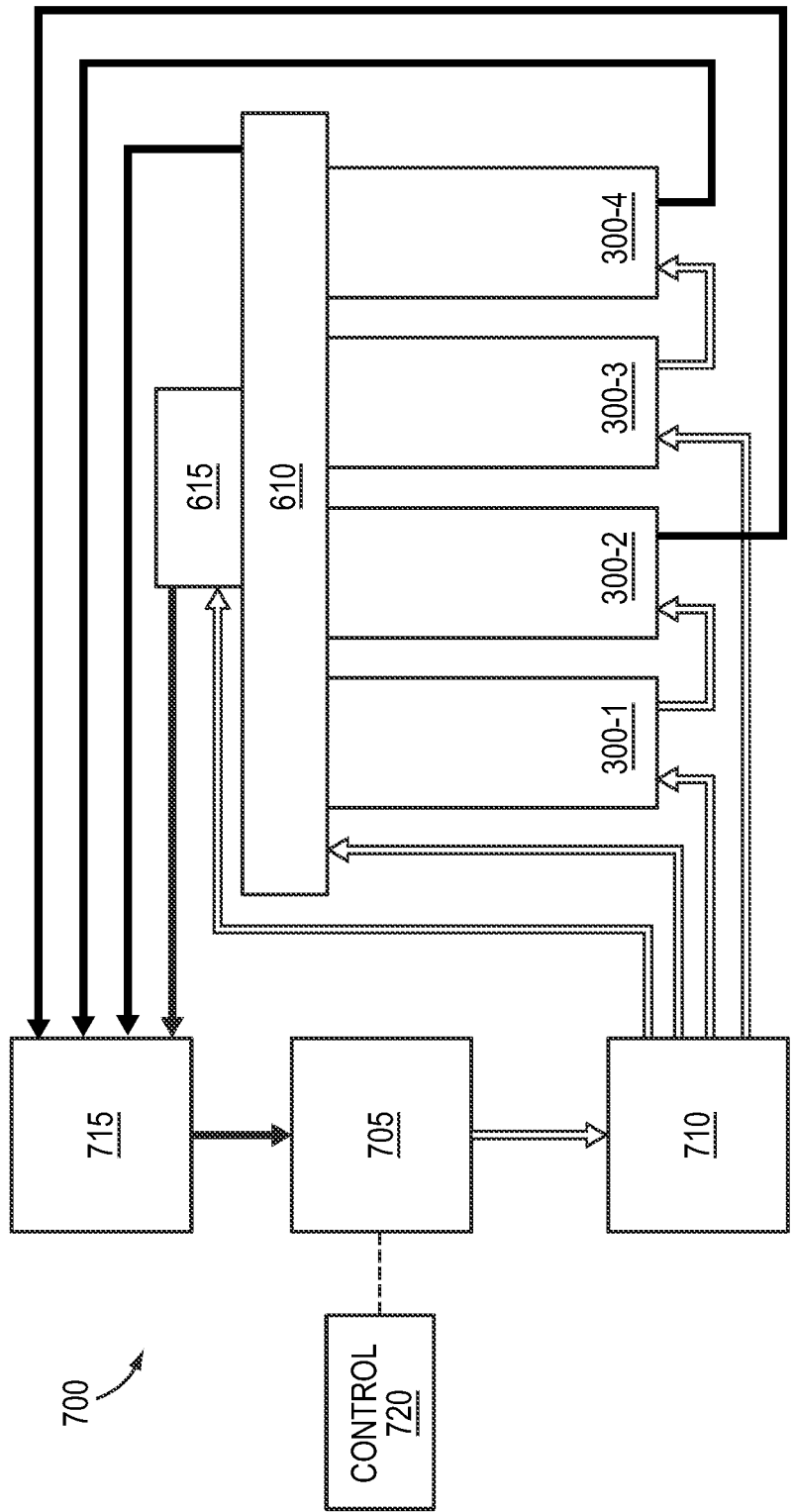
FIG. 7 is a schematic fluid-flow diagram for a laser system in accordance with various embodiments of the present invention.

FIG. 7 is a fluid-flow diagram for a laser system 700 in which various components of laser engine 600 share cooling fluid with the cooling loop 310 in each resonator 300. Laser system 700 is depicted as including four resonators 300-1-300-4, but embodiments of the invention may include fewer or more resonators. As shown in FIG. 7, cooling fluid flows from a chiller 705 (e.g., a heat exchanger, cooler, and/or coolant reservoir) to the various components of laser system 700 via an inlet manifold 710. Conduits from the inlet manifold 710 may be in fluid connection with the cooling loop 310 of one or more of the resonators 300. As shown, cooling fluid may flow from one resonator 300 to another resonator 300 (i.e., in series) before flowing back to the chiller 705 via an outlet manifold 715. In other embodiments, cooling fluid may flow into and out of each individual resonator 300 (i.e., the cooling loop 310 thereof) via dedicated conduits connected to the inlet manifold 710 and the outlet manifold 715. As also shown, cooling fluid may flow into cooling loops present within other component such as the beam-combining module 610 and/or fiber optic module 615 from the inlet manifold 710 via additional conduits.

In various embodiments, the temperature and/or the flow rate of the cooling fluid may be monitored by sensors (e.g., temperature sensors such as thermocouples or thermistors) in laser system 700 and controlled via a controller (or "control system") 720 in order to maintain the various components of laser system 700 at a desired temperature. As mentioned previously, the temperature of the cooling fluid in the cooling loops 310 may be maintained at a temperature higher than that of the cooling fluid utilized to cool the beam emitters in order to reduce or prevent condensation on or in the laser system.

In various embodiments, one or more other types of sensors may be included in laser system 700, and controller 720 may be responsive to such sensors. For example, sensors such as humidity or moisture sensors (e.g., a hygrometer) may be utilized to measure humidity or moisture levels in one or more locations in the laser system 700, and the temperature and/or the flow rate of the cooling fluid may be adjusted to reduce such levels. For example, the temperature and/or the flow rate of the cooling fluid through one or both cooling loops may be adjusted once the humidity or moisture level increases above a predetermined threshold.

The controller 720 may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680×0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described herein. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as FORTRAN, PASCAL, JAVA, C, C++, C#, BASIC, various scripting languages, and/or HTML. Additionally, the software may be implemented in an assembly language directed to the microprocessor resident on a target computer; for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

Figure 8:
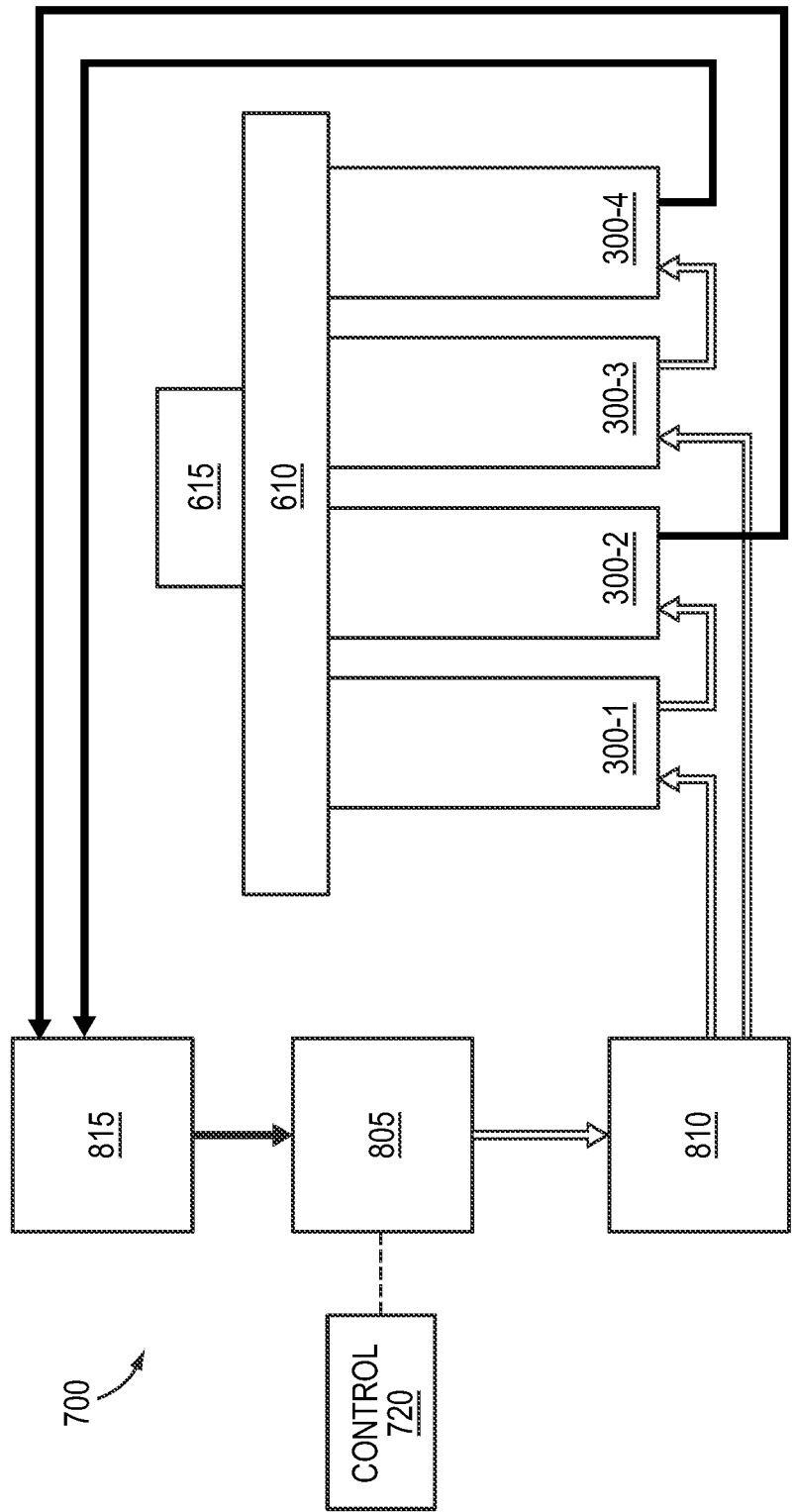
FIG. 8 is a schematic fluid-flow diagram for a laser system in accordance with various embodiments of the present invention.

FIG. 8 is a fluid-flow diagram for laser system 700 depicting the separate flow of cooling fluid to the emitter cooling loops in each of the resonators 300-1-300-4. As shown in FIG. 8, cooling fluid flows from a chiller 805 (e.g., a heat exchanger, cooler, and/or coolant reservoir) to the various resonators 300 via an inlet manifold 810. Conduits from the inlet manifold 810 may be in fluid connection with the emitter cooling loop of one or more of the resonators 300. As shown, cooling fluid may flow from one resonator 300 to another resonator 300 (i.e., in series) before flowing back to the chiller 805 via an outlet manifold 815. In other embodiments, cooling fluid may flow into and out of each individual resonator 300 (i.e., the emitter cooling loop thereof) via dedicated conduits connected to the inlet manifold 810 and the outlet manifold 815. As with chiller 705, the operation of chiller 805 (e.g., the temperature and/or flow rate of cooling fluid) may be controlled via controller 720 or a separate controller similar to and having the same functionality as controller 720. As detailed herein, the temperature of the cooling fluid supplied via chiller 805 is, in various embodiments, lower than that of the cooling fluid flowing to non-emitter components in FIG. 7 in order to prevent or reduce condensation in the laser system 700. All or portions of chiller 805, inlet manifold 810, and/or outlet manifold 815 may be shared with, or portions of, the chiller 705, inlet manifold 710, and/or outlet manifold 715 depicted in FIG. 7. However, typically the cooling fluid utilized in each loop is separate and maintained and supplied at a different temperature. In various embodiments, the cooling fluid utilized in the loop of FIG. 7 may even be a different type of cooling fluid utilized in the loop of FIG. 8. In other embodiments, the cooling fluids are the same material (e.g., water) and merely supplied at different temperatures.

As mentioned herein, in various embodiments of the present invention, the output beams of the laser systems or laser resonators may be propagated, e.g., via a fiber optic module, to a delivery optical fiber (which may be coupled to a laser delivery head) and/or utilized to process a workpiece. In various embodiments, a laser head contains one or more optical elements utilized to focus the output beam onto a workpiece for processing thereof. For example, laser heads in accordance with embodiments of the invention may include one or more collimators (i.e., collimating lenses) and/or focusing optics (e.g., one or more focusing lenses). A laser head may not include a collimator if the beam(s) entering the laser head are already collimated. Laser heads in accordance with various embodiments may also include one or more protective window, a focus-adjustment mechanism (manual or automatic, e.g., one or more dials and/or switches and/or selection buttons). Laser heads may also include one or more monitoring systems for, e.g., laser power, target material temperature and/or reflectivity, plasma spectrum, etc. A laser head may also include optical elements for beam shaping and/or adjustment of beam quality (e.g., variable BPP) and may also include control systems for polarization of the beam and/or the trajectory of the focusing spot. In various embodiments, the laser head may include one or more optical elements (e.g., lenses) and a lens manipulation system for selection and/or positioning thereof for, e.g., alteration of beam shape and/or BPP of the output beam, as detailed in U.S. patent application Ser. No. 15/188,076, filed on Jun. 21, 2016, the entire disclosure of which is incorporated by reference herein. Exemplary processes include cutting, piercing, welding, brazing, annealing, etc. The output beam may be translated relative to the workpiece (e.g., via translation of the beam and/or the workpiece) to traverse a processing path on or across at least a portion of the workpiece.

In embodiments utilizing an optical delivery fiber, the optical fiber may have many different internal configurations and geometries. For example, the optical fiber may include, consist essentially of, or consist of a central core region and an annular core region separated by an inner cladding layer. One or more outer cladding layers may be disposed around the annular core region. Embodiments of the invention may incorporate optical fibers having configurations described in U.S. patent application Ser. No. 15/479,745, filed on Apr. 5, 2017, and U.S. patent application Ser. No. 16/675,655, filed on Nov. 6, 2019, the entire disclosure of each of which is incorporated by reference herein.

In various embodiments, the controller may control the motion of the laser head or output beam relative to the workpiece via control of, e.g., one or more actuators. The controller may also operate a conventional positioning system configured to cause relative movement between the output laser beam and the workpiece being processed. For example, the positioning system may be any controllable optical, mechanical or opto-mechanical system for directing the beam through a processing path along a two- or three-dimensional workpiece. During processing, the controller may operate the positioning system and the laser system so that the laser beam traverses a processing path along the workpiece. The processing path may be provided by a user and stored in an onboard or remote memory, which may also store parameters relating to the type of processing (cutting, welding, etc.) and the beam parameters necessary to carry out that processing. The stored values may include, for example, beam wavelengths, beam shapes, beam polarizations, etc., suitable for various processes of the material (e.g., piercing, cutting, welding, etc.), the type of processing, and/or the geometry of the processing path.

As is well understood in the plotting and scanning art, the requisite relative motion between the output beam and the workpiece may be produced by optical deflection of the beam using a movable mirror, physical movement of the laser using a gantry, lead-screw or other arrangement, and/or a mechanical arrangement for moving the workpiece rather than (or in addition to) the beam. The controller may, in some embodiments, receive feedback regarding the position and/or processing efficacy of the beam relative to the workpiece from a feedback unit, which will be connected to suitable monitoring sensors.

In addition, the laser system may incorporate one or more systems for detecting the thickness of the workpiece and/or heights of features thereon. For example, the laser system may incorporate systems (or components thereof) for interferometric depth measurement of the workpiece, as detailed in U.S. patent application Ser. No. 14/676,070, filed on Apr. 1, 2015, the entire disclosure of which is incorporated by reference herein. Such depth or thickness information may be utilized by the controller to control the output beam to optimize the processing (e.g., cutting, piercing, or welding) of the workpiece, e.g., in accordance with records in the database corresponding to the type of material being processed.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. A laser resonator comprising:
a resonator housing;
a plurality of beam emitters, each configured to emit one or more beams, disposed within the resonator housing;
disposed within the resonator housing, an enclosed cooling manifold for cooling the beam emitters via flow of a first cooling fluid through a first conduit within the cooling manifold;
a manifold fluid inlet for supplying the first cooling fluid to the cooling manifold;
a manifold fluid outlet for receiving the first cooling fluid from the cooling manifold; and
fluidly connecting the manifold fluid inlet and the manifold fluid outlet with the first conduit, and separate from the cooling manifold, a feeder manifold extending through the resonator housing.

2. The laser resonator of claim 1, further comprising a first seal between the feeder manifold and the cooling manifold.

3. The laser resonator of claim 2, wherein the first seal comprises an o-ring or a gasket.

4. The laser resonator of claim 1, wherein the cooling manifold is separated from the resonator housing at one or more locations by an air gap therebetween.

5. The laser resonator of claim 1, further comprising, between the cooling manifold and the resonator housing, a second seal for preventing flow of air into or out of the resonator housing.

6. The laser resonator of claim 5, wherein the second seal comprises an o-ring or a gasket.

7. The laser resonator of claim 1, wherein the cooling manifold comprises a plastic material.

8. The laser resonator of claim 7, wherein the plastic material contains a non-plastic filler material.

9. The laser resonator of claim 8, wherein the filler material comprises glass.

10. The laser resonator of claim 7, wherein the laser resonator comprises a metallic material.

11. The laser resonator of claim 10, wherein the laser resonator comprises aluminum.

12. The laser resonator of claim 1, wherein the cooling manifold comprises at least one of polyetherimide or polyetheretherketone.

13. The laser resonator of claim 1, wherein:
the cooling manifold comprises a first material;
the resonator housing comprises a second material; and
a thermal conductivity of the second material is greater than a thermal conductivity of the first material.

14. The laser resonator of claim 1, wherein:
the cooling manifold is disposed below the plurality of beam emitters; and
below each beam emitter, the cooling manifold defines a protrusion extending toward the beam emitter.

15. The laser resonator of claim 14, wherein each protrusion is sealed to the beam emitter thereabove via one or more seals.

16. The laser resonator of claim 15, wherein each said seal comprises an o-ring or a gasket.

17. The laser resonator of claim 1, wherein each beam emitter comprises:
a laser diode or diode bar;
an active cooler disposed beneath the laser diode or diode bar, the active cooler fluidly connected to the first conduit; and
a base plate disposed beneath the active cooler.

18. The laser resonator of claim 17, wherein the active cooler comprises an impingement cooler or a microchannel cooler.

19. The laser resonator of claim 17, wherein a portion of the base plate directly underlying the laser diode or diode bar is separated from the cooling manifold by an air gap.

20. The laser resonator of claim 17, wherein the base plate comprises a ceramic material.

21. The laser resonator of claim 17, wherein the base plate comprises alumina.

22. The laser resonator of claim 17, wherein:
the base plate comprises a first material;
the resonator housing comprises a second material; and
a thermal conductivity of the second material is greater than a thermal conductivity of the first material.

23. The laser resonator of claim 1, further comprising:
disposed within the resonator housing, one or more components for receiving and/or manipulating the beams from the beam emitters;
fluidly isolated from the cooling manifold and extending through the resonator housing, a second conduit for cooling the one or more components via flow of a second cooling fluid therethrough;
a housing fluid inlet, different from the manifold fluid inlet, for supplying the second cooling fluid to the second conduit; and
a housing fluid outlet, different from the manifold fluid outlet, for receiving the second cooling fluid from the second conduit.

* * * * *